(12) United States Patent
Lee et al.

(10) Patent No.: US 11,380,386 B2
(45) Date of Patent: Jul. 5, 2022

(54) NONVOLATILE MEMORY DEVICE INCLUDING SENSING TIME CONTROL CIRCUIT AND OPERATING METHOD THEREOF

(71) Applicant: Samsung Electronics Co., Ltd., Suwon-si (KR)

(72) Inventors: Soo-Woong Lee, Seoul (KR); Doo-Ho Cho, Seoul (KR); Sang Soo Park, Hwaseong-si (KR); Yongkyu Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/147,557

(22) Filed: Jan. 13, 2021

(65) Prior Publication Data

US 2021/0391000 A1 Dec. 16, 2021

(30) Foreign Application Priority Data

Jun. 15, 2020 (KR) .................... 10-2020-0072496

(51) Int. Cl.
| | |
|---|---|
| *G11C 16/12* | (2006.01) |
| *G11C 11/4091* | (2006.01) |
| *G11C 11/4094* | (2006.01) |
| *G11C 11/4074* | (2006.01) |
| *G11C 11/4076* | (2006.01) |
| *G11C 11/4093* | (2006.01) |
| *G11C 16/04* | (2006.01) |
| *G11C 16/34* | (2006.01) |

(Continued)

(52) U.S. Cl.
CPC ...... *G11C 11/4091* (2013.01); *G11C 11/4074* (2013.01); *G11C 11/4076* (2013.01); *G11C 11/4093* (2013.01); *G11C 11/4094* (2013.01); *G11C 16/0483* (2013.01); *G11C 16/28* (2013.01); *G11C 16/32* (2013.01); *G11C 16/34* (2013.01); *G11C 16/3418* (2013.01)

(58) Field of Classification Search
CPC ..... G11C 16/0483; G11C 16/32; G11C 16/34; G11C 16/26
See application file for complete search history.

(56) References Cited

U.S. PATENT DOCUMENTS

| | | | |
|---|---|---|---|
| 6,009,040 A | * 12/1999 | Choi | G11C 11/5621 365/210.1 |
| 8,908,441 B1 | 12/2014 | Dutta et al. | |
| 9,336,084 B2 | 5/2016 | Baker | |

(Continued)

FOREIGN PATENT DOCUMENTS

JP 5470368 B2 4/2014

*Primary Examiner* — Mushfique Siddique
(74) *Attorney, Agent, or Firm* — Muir Patent Law, PLLC

(57) ABSTRACT

Disclosed is a nonvolatile memory device, which includes a memory cell array that includes a plurality of memory cells, a page buffer circuit that is connected with the memory cell array through a plurality of bit lines and performs a sensing operation of sensing memory cells selected from the plurality of memory cells through the plurality of bit lines during a sensing time, an input/output circuit that performs a data output operation of outputting data from the page buffer circuit to an external device through data lines, and a sensing time control circuit that adjusts the sensing time when the data output operation is performed during the sensing time.

19 Claims, 23 Drawing Sheets

(51) Int. Cl.
  *G11C 16/32* (2006.01)
  *G11C 16/28* (2006.01)

(56) References Cited

U.S. PATENT DOCUMENTS

| | | | |
|---|---|---|---|
| 10,134,477 B2 | 11/2018 | Park et al. | |
| 10,199,102 B2 | 2/2019 | Terada | |
| 10,496,475 B2 | 12/2019 | Zhang et al. | |
| 2008/0247241 A1 | 10/2008 | Nguyen et al. | |
| 2010/0074026 A1* | 3/2010 | Kang | G11C 11/5642 365/185.25 |
| 2011/0305091 A1* | 12/2011 | Lee | G11C 16/32 365/185.25 |
| 2012/0137067 A1* | 5/2012 | Lee | G11C 16/0483 711/114 |
| 2018/0322929 A1* | 11/2018 | Park | G11C 11/5642 |
| 2019/0347044 A1 | 11/2019 | Kim | |
| 2019/0392893 A1 | 12/2019 | Yang et al. | |
| 2020/0098436 A1* | 3/2020 | Kim | G11C 16/14 |
| 2020/0258577 A1* | 8/2020 | Lee | G11C 7/106 |
| 2021/0005268 A1* | 1/2021 | Kim | G11C 16/08 |
| 2021/0090620 A1* | 3/2021 | Yang | G11C 7/1057 |
| 2021/0118513 A1* | 4/2021 | Kim | G11C 16/3459 |

\* cited by examiner

NONVOLATILE MEMORY DEVICE INCLUDING SENSING TIME CONTROL CIRCUIT AND OPERATING METHOD THEREOF

CROSS-REFERENCE TO RELATED APPLICATIONS

This application claims priority under 35 U.S.C. § 119 to Korean Patent Application No. 10-2020-0072496 filed on Jun. 15, 2020, in the Korean Intellectual Property Office, the disclosure of which is incorporated by reference herein in its entirety.

BACKGROUND

Embodiments of the inventive concept relate to a semiconductor memory, and more particularly, relate to a nonvolatile memory device and an operating method of the nonvolatile memory device.

Semiconductor memory devices are classified as volatile memory devices, in which stored data disappear when a power is turned off, such as a static random access memory (SRAM) or a dynamic random access memory (DRAM), or nonvolatile memory devices, in which stored data are retained even when a power is turned off, such as a flash memory device, a phase-change RAM (PRAM), a magnetic RAM (MRAM), a resistive RAM (RRAM), or a ferroelectric RAM (FRAM).

In a nonvolatile semiconductor memory device, errors may be generated due to various factors, such as power noise. A nonvolatile semiconductor memory device may secure reliability by removing a memory block, in which an error is generated, from a mapping table. However, in most cases, an error due to power noise may be temporary unlike an error due to physical defects. So, rather than removing a memory block from a mapping table, other ways to improve reliability may be desirable. In particular, methods of reducing errors due to power noise may be desirable.

SUMMARY

Embodiments of the inventive concept provide a nonvolatile memory device with an improved performance and an operating method of the nonvolatile memory device.

According to an exemplary embodiment, a nonvolatile memory device includes a memory cell array that includes a plurality of memory cells, a page buffer circuit that is connected to the memory cell array through a plurality of bit lines and performs a sensing operation of sensing memory cells selected from the plurality of memory cells through the plurality of bit lines during a sensing time period, an input/output circuit that performs a data output operation of outputting data from the page buffer circuit to an external device through data lines, and a sensing time control circuit that adjusts a duration of the sensing time period when the data output operation is performed during the sensing time period.

According to an exemplary embodiment, an operating method of a nonvolatile memory device includes performing, at a page buffer circuit, a first sensing operation on a first page, performing, at the page buffer circuit, a second sensing operation on a second page, and performing, at an input/output circuit, a first data output operation for the first page while performing the second sensing operation. The first sensing operation is performed for a first time duration, and the second sensing operation is performed for a second time duration shorter than the first time duration.

According to an exemplary embodiment, a nonvolatile memory device includes a memory cell array that includes a first plane and a second plane, a first page buffer that is connected with the first plane through first bit lines and performs a first sensing operation on the first plane, a second page buffer that is connected with the second plane through second bit lines and performs a second sensing operation on the second plane, an input/output circuit that performs a data output operation of outputting data from the first page buffer and data from the second page buffer to an external device through data lines, and a sensing time control circuit that adjusts a sensing time corresponding to the second sensing operation, when the input/output circuit outputs the data from the first page buffer to the external device while the second page buffer performs the second sensing operation.

BRIEF DESCRIPTION OF THE FIGURES

The above and other objects and features of the inventive concept will become apparent by describing in detail exemplary embodiments thereof with reference to the accompanying drawings.

DETAILED DESCRIPTION

Below, embodiments of the inventive concept are described in detail and clearly to such an extent that an ordinary one in the art easily implements the inventive concept.

Figure 1:
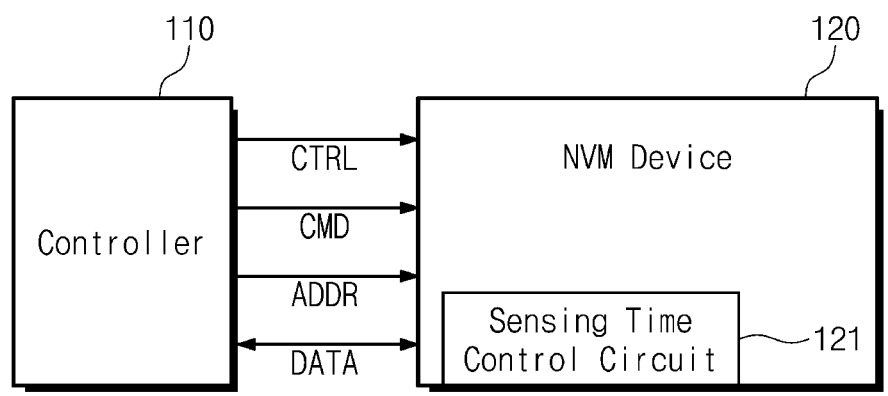
FIG. 1 is a block diagram illustrating a storage device according to an embodiment of the inventive concept.

FIG. 1 is a block diagram illustrating a storage device according to an embodiment of the inventive concept. Referring to FIG. 1, a storage device 100 may include a memory controller 110 and a nonvolatile memory device 120. The storage device 100 may be a high-capacity storage device included in electronic devices such as a personal computer (PC), a server, a workstation, a smartphone, a tablet PC, and a wearable device.

The memory controller 110 may write data "DATA" into the nonvolatile memory device 120 or may read the data "DATA" stored in the nonvolatile memory device 120. For example, the memory controller 110 may provide the nonvolatile memory device 120 with various signals (e.g., a control signal CTRL, a command CMD, and an address ADDR) for controlling the nonvolatile memory device 120.

The nonvolatile memory device 120 may operate in response to various signals received from the memory controller 110. For example, under control of the memory controller 110, the nonvolatile memory device 120 may store the data "DATA" received from the memory controller 110 or may provide the data "DATA" stored therein to the memory controller 110.

In an exemplary embodiment, the nonvolatile memory device 120 may include a NAND flash memory. However, the inventive concept is not limited thereto. For example, the nonvolatile memory device 120 may be implemented with one or a combination of various nonvolatile memory devices such as a phase change RAM (PRAM), a magnetic RAM (MRAM), a resistive RAM (RRAM), and a ferroelectric RAM (FRAM). A nonvolatile memory device 120 may be in form of a semiconductor chip (e.g., memory chip formed on a die), a stack of semiconductor chips, a semiconductor package including one or more semiconductor chips (e.g., one or more memory chips and optionally one or more logic chips) stacked on a package substrate, or a package-on-package device including a plurality of packages. These devices may be formed using ball grid arrays, wire bonding, through substrate vias, or other electrical connection elements. A nonvolatile memory device may also be in the form of a memory module.

In an exemplary embodiment, the nonvolatile memory device 120 may include a sensing time control circuit 121. The sensing time control circuit 121 may be configured to adjust a sensing time during a sensing operation of a read operation according to an embodiment of the inventive concept. As the nonvolatile memory device 120 adjusts the sensing time, an influence of a power noise due to a data output, which power noise occurs during the sensing operation, may decrease. The various circuits described herein may be physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Furthermore, each circuit, block, unit and/or module of the embodiments may be physically separated into two or more interacting and discrete circuits, blocks, units and/or modules, or combined from two or more interacting and discrete circuits, blocks, units and/or modules, without departing from the scope of the inventive concepts.

A conventional nonvolatile memory device repeats performance of a sensing operation when a sensing error occurs due to a power noise during a read operation. This causes a decrease in read performance of the nonvolatile memory device. In contrast, instead of repeating performance of a sensing operation, the nonvolatile memory device 120 according to an embodiment of the inventive concept may adjust the sensing time during the read operation, thus reducing the influence of a power noise due to a data output. This may mean that the performance of the nonvolatile memory device 120 is improved. A method of compensating for a power noise due to a data output during a sensing operation of the nonvolatile memory device 120 according to the inventive concept will be described with reference to drawings below.

Figure 2:
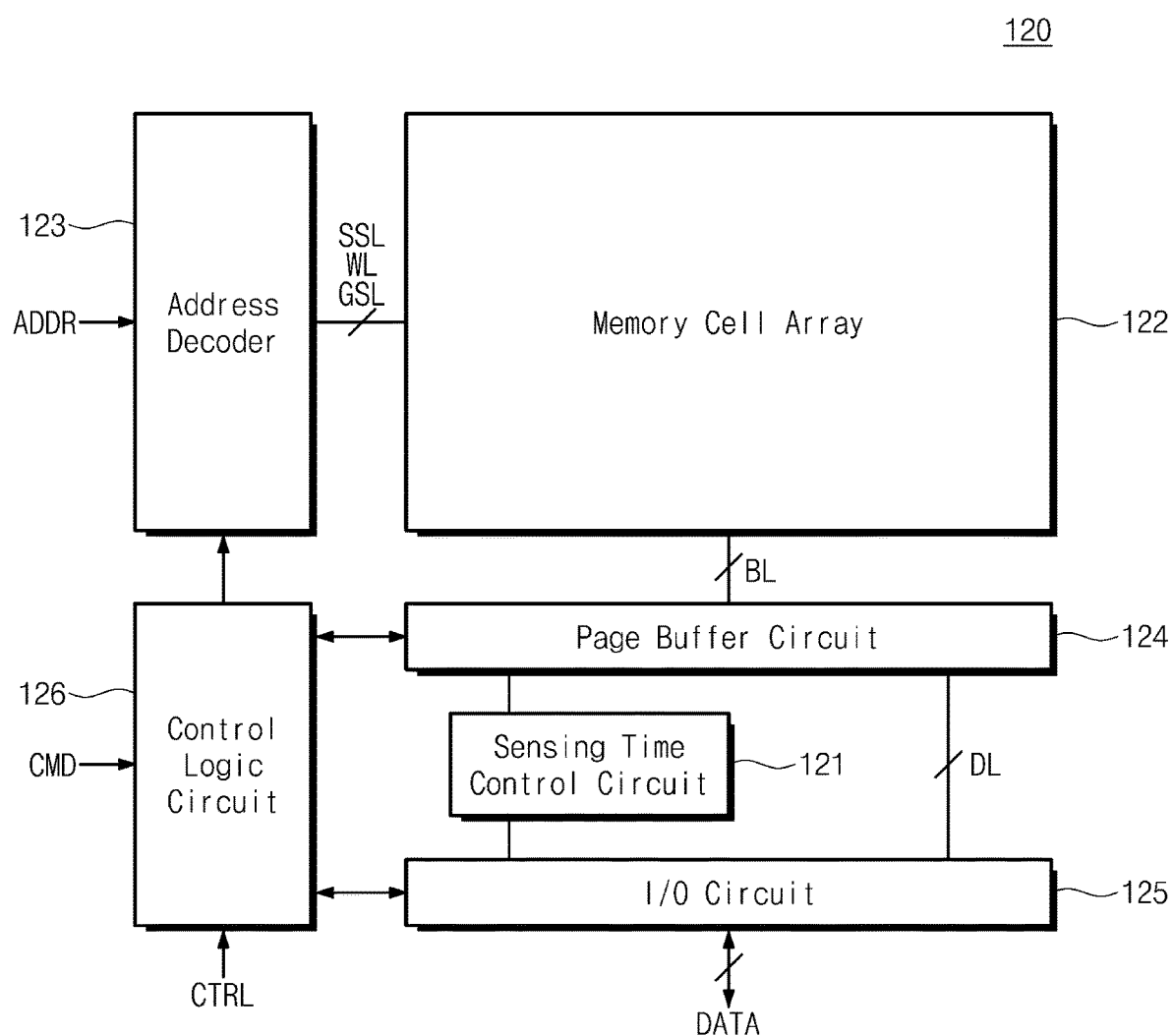
FIG. 2 is a block diagram illustrating a nonvolatile memory device of FIG. 1, according to an embodiment of the inventive concept.

FIG. 2 is a block diagram illustrating a nonvolatile memory device of FIG. 1, according to an example embodiment. Below, for convenience of description, it is assumed that the nonvolatile memory device 120 is a NAND flash memory device. However, the inventive concept is not limited thereto.

Referring to FIGS. 1 and 2, the nonvolatile memory device 120 may include the sensing time control circuit 121, a memory cell array 122, an address decoder 123, a page buffer circuit 124, an input/output circuit 125, and a control logic circuit 126. The memory cell array 122 may include a plurality of memory blocks. Each of the plurality of memory blocks will be more fully described with reference to FIG. 3.

The sensing time control circuit 121 may adjust a sensing time during a sensing operation such that the influence of a power noise due to a data output operation performed during the sensing operation decreases. The sensing time control circuit 121 may receive information about the data output operation from the input/output circuit 125. For example, the sensing time control circuit 121 may receive information indicating whether the data output operation is being performed during the sensing operation and information about a data output count, from the input/output circuit 125. The sensing time control circuit 121 may extract a data output count value from the information about the data output count. In an exemplary embodiment, the information about the data output count may include a data strobe signal (not illustrated) and a column address (not illustrated). The information about the data output count will be more fully described with reference to a drawing below.

The sensing time control circuit 121 may adjust a sensing time by using the information received from the input/output circuit 125. To apply the adjusted sensing time, the sensing time control circuit 121 may transmit a sensing end signal to the page buffer circuit 124 at a required time. The sensing end signal may indicate that a sensing operation is terminated when the adjusted sensing time from a start of the sensing operation passes.

The nonvolatile memory device 120 may receive a read command and an address from the memory controller 110. In response to the read command, the nonvolatile memory device 120 may read data corresponding to the received address from the memory cell array 122. The read operation may include a sensing operation and a data output operation.

The sensing operation refers to an operation of sensing data stored in selected memory cells through bit lines and storing or setting the sensed data in the page buffer circuit 124 (e.g., cache latches) or the input/output circuit 125, under control of the sensing time control circuit 121, such that read data stored in the memory cell array 122 are output to the memory controller 110.

The data output operation indicates an operation of generating a data strobe signal (not illustrated) and outputting data received from the input/output circuit 125 through data lines in synchronization with the data strobe signal, in response to a read enable signal (not illustrated) of the control signal CTRL, after the sensing operation is completed.

The address decoder 123 may be connected to the memory cell array 122 through string selection lines SSL, word lines WL, and ground selection lines GSL. The address decoder 123 may receive an address ADDR from the memory controller 110. The address decoder 123 may decode the address ADDR and may control voltages of the string selection lines SSL, the word lines WL, and the ground selection lines GSL based on the decoded result.

The page buffer circuit 124 is connected to the memory cell array 122 through bit lines BL. The page buffer circuit 124 may be configured to temporarily store data read from the memory cell array 122 or to temporarily store data to be stored in the memory cell array 122.

The input/output circuit 125 may provide the data "DATA" received from the memory controller 110 to the page buffer circuit 124 through data lines DL or may provide the data "DATA" received from the page buffer circuit 124 through the data lines DL to the memory controller 110. In an exemplary embodiment, the input/output circuit 125 may exchange the data "DATA" with the memory controller 110 in synchronization with a data strobe signal (DQS) (not illustrated). In an exemplary embodiment, information such as the command CMD or the address ADDR illustrated in FIG. 2 may be received through the input/output circuit 125 and may be provided to circuits respectively corresponding to the pieces of information thus received.

The control logic circuit 126 controls overall operations of the nonvolatile memory device 120. For example, the control logic circuit 126 may control the respective components of the nonvolatile memory device 120 based on the command CMD or the control signal CTRL from the memory controller 110 such that the nonvolatile memory device 120 performs various operations (e.g., a program operation, a read operation, and an erase operation).

Figure 3:
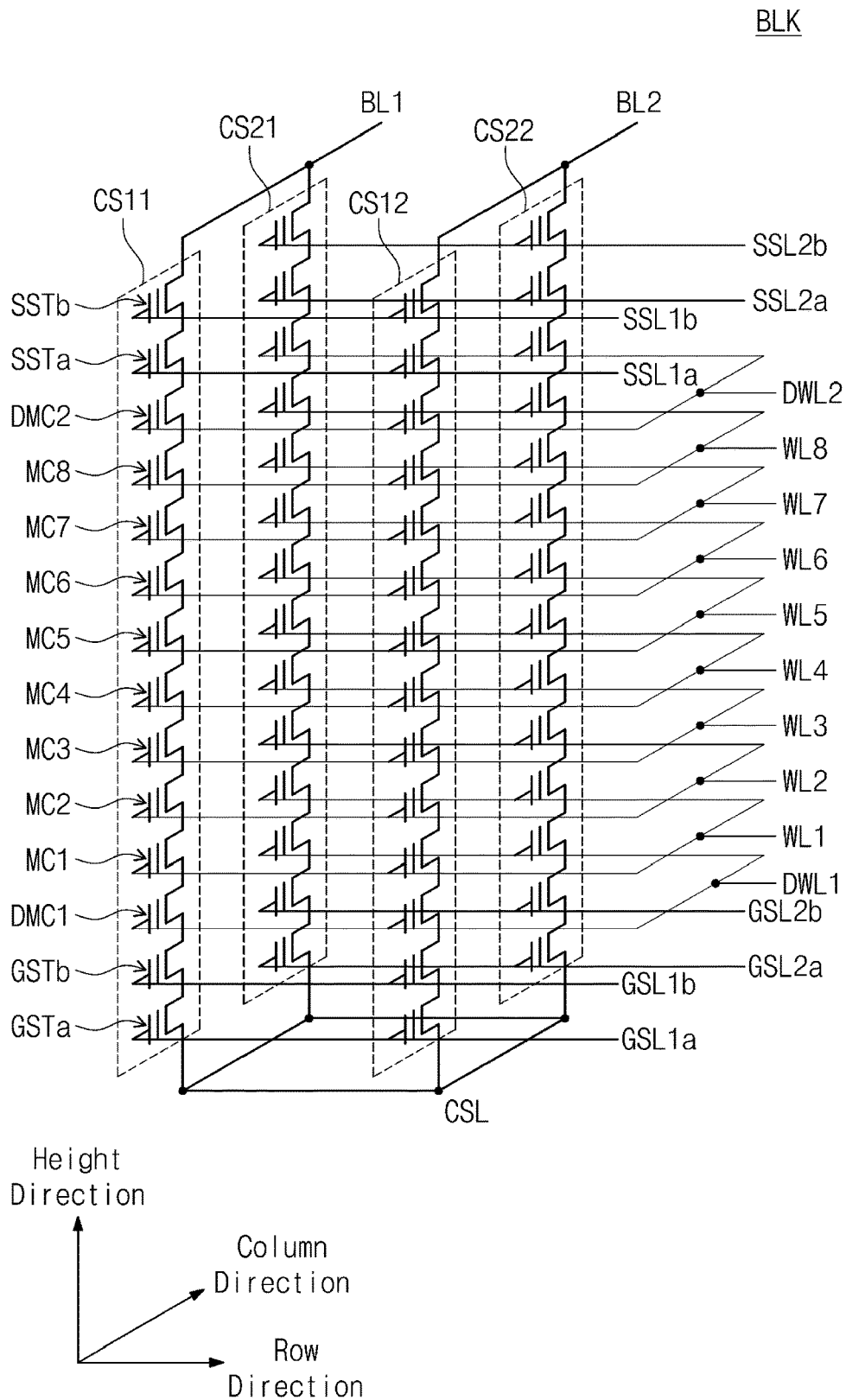
FIG. 3 is a circuit diagram illustrating one memory block of a plurality of memory blocks included in a memory cell array of FIG. 2, according to an embodiment of the inventive concept.

FIG. 3 is a circuit diagram illustrating one memory block BLK of a plurality of memory blocks included in a memory cell array of FIG. 2. One memory block BLK will be described with reference to FIG. 3, but the inventive concept is not limited thereto. A plurality of memory blocks included in the memory cell array 122 may have a structure that is identical or similar to the structure of the memory block BLK illustrated in FIG. 3.

Referring to FIGS. 2 and 3, the memory block BLK includes a plurality of cell strings CS11, CS12, CS21, and CS22. The plurality of cell strings CS11, CS12, CS21, and CS22 are arranged in a row direction and a column direction.

Cell strings belonging to the same column from among the plurality of cell strings CS11, CS12, CS21, and CS22 are connected with the same bit line. For example, the cell strings CS11 and CS21 may be connected to a first bit line BL1, and the cell strings CS12 and CS22 may be connected to a second bit line BL2.

Each of the plurality of cell strings CS11, CS12, CS21, and CS22 includes a plurality of cell transistors. Each of the plurality of cell transistors may include a charge trap flash (CTF) memory cell. The plurality of cell transistors may be stacked in a height direction that is a direction perpendicular to a plane (e.g., a semiconductor substrate (not illustrated)) defined by the row direction and the column direction.

In each cell string, the plurality of cell transistors are connected in series between a corresponding bit line (e.g., BL1 or BL2) and a common source line CSL. For example, the plurality of cell transistors may include string selection transistors SSTa and SSTb, dummy memory cells DMC1 and DMC2, memory cells MC1 to MC8, and ground selection transistors GSTa and GSTb. The serially-connected string selection transistors SSTa and SSTb may be provided between serially-connected memory cells MC1 to MC8 and a corresponding bit line (e.g., BL1 and BL2). The serially-connected ground selection transistors GSTa and GSTb may be provided between the serially-connected memory cells MC1 to MC8 and the common source line CSL.

In an exemplary embodiment, the second dummy memory cell DMC2 may be provided between the serially-connected string selection transistors SSTb and SSTa and the serially-connected memory cells MC1 to MC8, and the first dummy memory cell DMC1 may be provided between the serially-connected memory cells MC1 to MC8 and the serially-connected ground selection transistors GSTb and GSTa.

In each of the plurality of cell strings CS11, CS12, CS21, and CS22, memory cells positioned at the same height from among the memory cells MC1 to MC8 may share the same word line. For example, the first memory cells MC1 of the plurality of cell strings CS11, CS12, CS21, and CS22 may be positioned at the same height from the substrate (not illustrated) and may share a first word line WL1. The second memory cells MC2 of the plurality of cell strings CS11, CS12, CS21, and CS22 may be positioned at the same height from the substrate (not illustrated) and may share a second word line WL2. Likewise, the third to eighth memory cells MC3 to MC8 of the plurality of cell strings CS11, CS12, CS21, and CS22 may be positioned at the same heights from the substrate (not illustrated) and may share third to eighth word lines WL3 to WL8, respectively.

Dummy memory cells positioned at the same height from among the dummy memory cells DMC1 and DMC2 of the plurality of cell strings CS11, CS12, CS21, and CS22 may share the same dummy word line. For example, the first dummy memory cells DMC1 of the plurality of cell strings CS11, CS12, CS21, and CS22 may share a first dummy word line DWL1, and the second dummy memory cells DMC2 of the plurality of cell strings CS11, CS12, CS21, and CS22 may share a second dummy word line DWL2.

String selection transistors positioned at the same height and the same row from among the string selection transistors SSTa and SSTb of the plurality of cell strings CS11, CS12, CS21, and CS22 may share the same string selection line. For example, the string selection transistors SSTb of the cell strings CS11 and CS12 may share a string selection line SSL1b, and the string selection transistors SSTa of the cell strings CS11 and CS12 may share a string selection line SSL1a. The string selection transistors SSTb of the cell strings CS21 and CS22 may share a string selection line SSL2b, and the string selection transistors SSTa of the cell strings CS21 and CS22 may share a string selection line SSL2a.

Although not illustrated in the drawings, string selection transistors positioned at the same row from among the string selection transistors SSTa and SSTb of the plurality of cell strings CS11, CS12, CS21, and CS22 may share the same string selection line. For example, the string selection transistors SSTb and SSTa of the cell strings CS11 and CS12 may share a first string selection line, and the string selection transistors SSTb and SSTa of the cell strings CS21 and CS22 may share a second string selection line different from the first string selection line.

Ground selection transistors positioned at the same height and the same row from among the ground selection transistors GSTb and GSTa of the plurality of cell strings CS11, CS12, CS21, and CS22 may share the same ground selection line. For example, the ground selection transistors GSTb of the cell strings CS11 and CS12 may be connected with a ground selection line GSL1b, and the ground selection transistors GSTa of the cell strings CS11 and CS12 may share a ground selection line GSL1a. The ground selection transistors GSTb of the cell strings CS21 and CS22 may be connected with a ground selection line GSL2b, and the ground selection transistors GSTa of the cell strings CS21 and CS22 may share a ground selection line GSL2a.

Although not illustrated in drawings, the ground selection transistors GSTb and GSTa of the plurality of cell strings CS11, CS12, CS21, and CS22 may share the same ground selection line. Alternatively, ground selection transistors positioned at the same height from among the ground selection transistors GSTb and GSTa of the plurality of cell strings CS11, CS12, CS21, and CS22 may share the same ground selection line. Alternatively, ground selection transistors positioned at the same row from among the ground selection transistors GSTb and GSTa of the plurality of cell strings CS11, CS12, CS21, and CS22 may share the same ground selection line.

In an exemplary embodiment, although not illustrated in drawings, each of the plurality of cell strings CS11, CS12, CS21, and CS22 of the memory block BLK may further include an erase control transistor ECT. The erase control transistors ECT of the plurality of cell strings CS11, CS12, CS21, and CS22 may be positioned at the same height from the substrate and may be connected with the same erase control line ECL. For example, in each of the plurality of cell strings CS11, CS12, CS21, and CS22, the erase control transistor ECT may be interposed between the ground selection transistor GSTa and the common source line CSL. Alternatively, in each of the plurality of cell strings CS11, CS12, CS21, and CS22, the erase control transistor ECT may be interposed between the corresponding bit line BL1 or BL2 and the string selection transistor SSTb. However, the inventive concept is not limited thereto.

The memory block BLK illustrated in FIG. 3 is exemplary only. For example, the number of cell strings may increase or decrease, and the number of rows of cell strings and the number of columns of cell strings may increase or decrease depending on the change in the number of cell strings. Also, in the memory block BLK, the number of cell transistors (e.g., GST, MC, DMC, and SST) may increase or decrease, and the height of the memory block BLK may increase or decrease depending on the number of cell transistors (e.g., GST, MC, DMC, and SST). In addition, depending on the number of cell transistors, the number of lines (e.g., GSL, WL, DWL, and SSL) connected with the cell transistors may increase or decrease.

Figure 4:
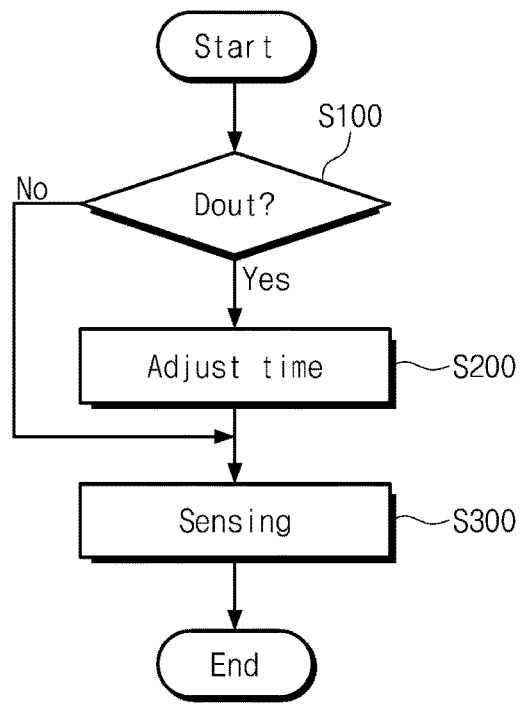
FIG. 4 is a flowchart illustrating an operating method of a nonvolatile memory device according to an embodiment of the inventive concept.

FIG. 4 is a flowchart illustrating an operating method of a nonvolatile memory device according to an embodiment of the inventive concept. A method of reducing the influence of a power noise due to a data output operation during a sensing operation will be described with reference to FIG. 4.

Referring to FIGS. 2 and 4, in operation S100, the nonvolatile memory device 120 may detect whether the data output operation is performed during the sensing operation for reading data stored in the memory cell array 122. The nonvolatile memory device 120 may perform the sensing operation by using the page buffer circuit 124 and may simultaneously perform the data output operation by using the input/output circuit 125. In a cache read operation, the nonvolatile memory device 120 may perform the data output operation for a first page while performing the sensing operation on a second page. The cache read operation may be an operation of reading data of sequential pages. In response to a cache read command, the nonvolatile memory device 120 may perform the sensing operation for the first page, the sensing operation for the second page, and the data output operation for the first page.

Also, the nonvolatile memory device 120 that includes a plurality of planes may perform the data output operation for a first plane while performing the sensing operation for a second plane. As such, the nonvolatile memory device 120 may determine whether the data output operation is performed at the input/output circuit 125, while performing the sensing operation at the page buffer circuit 124 in parallel with the data output operation.

When the data output operation is not performed at the input/output circuit 125 while the sensing operation for a page is performed at the page buffer circuit 124, the nonvolatile memory device 120 may proceed to operation S300. That is, without adjusting a sensing time, the nonvolatile memory device 120 performs the sensing operation during a default sensing time for the purpose of reading data stored in the memory cell array 122. The default sensing time may be determined depending on a characteristic of the nonvolatile memory device 120.

In the case where the input/output circuit 125 performs the data output operation in parallel (e.g., simultaneously) while the page buffer circuit 124 performs the sensing operation, the nonvolatile memory device 120 may proceed to operation S200. In operation S200, the sensing time control circuit 121 of the nonvolatile memory device 120 may adjust the sensing time to be applied to the sensing operation for reading data stored in the memory cell array 122. For example, the sensing time control circuit 121 may make the sensing time shorter than the default sensing time. A method of adjusting a sensing time will be more fully described with reference to FIGS. 7 and 9.

In operation S300 after step S200 is performed, the nonvolatile memory device 120 performs the sensing operation based on the adjusted sensing time. The nonvolatile memory device 120 may perform the sensing operation according to the adjusted sensing time under control of the sensing time control circuit 121.

Figure 5:
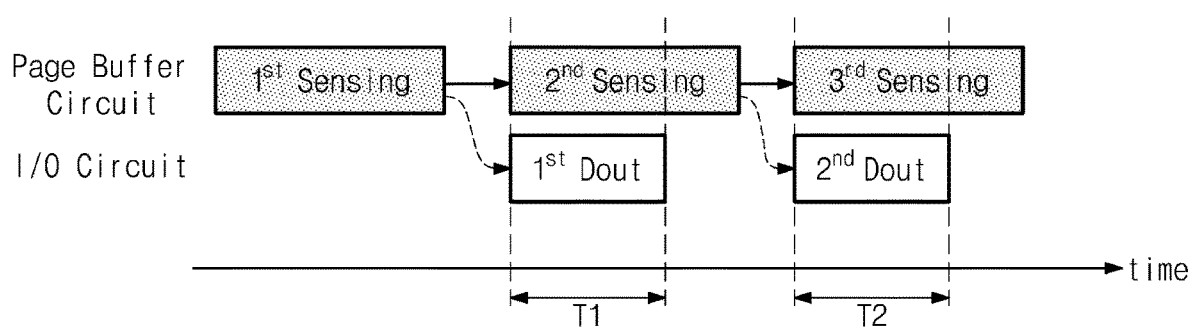
FIG. 5 is a timing diagram for describing an operating method of a nonvolatile memory device.

FIG. 5 is a timing diagram for describing an operating method of a nonvolatile memory device. The case where the sensing operation and the data output operation overlap each other will be described with reference to FIGS. 2, 4, and 5. The nonvolatile memory device 120 may sequentially perform a sensing operation $1^{st}$ Sensing for a first page, a sensing operation $2^{nd}$ Sensing for a second page, and a sensing operation $3^{rd}$ Sensing for a third page at the page buffer circuit 124. The nonvolatile memory device 120 may sequentially perform a data output operation $1^{st}$ Dout for the first page and a data output operation $2^{nd}$ Dout for the second page at the input/output circuit 125.

The nonvolatile memory device 120 may perform the sensing operation $1^{st}$ Sensing for the first page at the page buffer circuit 124. Afterwards, the nonvolatile memory device 120 may perform the data output operation $1^{st}$ Dout for the first page at the input/output circuit 125. The nonvolatile memory device 120 may perform the sensing operation $2^{nd}$ Sensing for the second page at the page buffer circuit 124. Afterwards, the nonvolatile memory device 120 may perform the data output operation $2^{nd}$ Dout for the second page at the input/output circuit 125.

During a first time T1, the nonvolatile memory device 120 may perform the data output operation $1^{st}$ Dout for the first page at the input/output circuit 125 at the same time as performing the sensing operation $2^{nd}$ Sensing for the second page. Afterwards, during a second time T2, the nonvolatile memory device 120 may perform the data output operation $2^{nd}$ Dout for the second page at the input/output circuit 125 at the same time as performing the sensing operation $3^{rd}$ Sensing for the third page.

As illustrated in FIG. 5, the sensing operation $2^{nd}$ Sensing for the second page and the data output operation $1^{st}$ Dout for the first page may overlap each other during the first time T1, and the sensing operation $3^{rd}$ Sensing for the third page and the data output operation $2^{nd}$ Dout for the second page may overlap each other during the second time T2.

During the first time T1, a power noise may occur due to the data output operation $1^{st}$ Dout for the first page, and a sensing error may occur during the sensing operation $2^{nd}$ Sensing for the second page due to the power noise. During the second time T2, a power noise may occur due to the data output operation $2^{nd}$ Dout for the second page, and a sensing error may occur during the sensing operation $3^{rd}$ Sensing for the third page due to the power noise. For example, data that are stored to have a first logical value may be read as having a second logical value, and data that are stored to have the second logical value may be read as having the first logical value. The sensing time control circuit 121 of the nonvolatile memory device 120 according to an embodiment of the inventive concept may adjust a sensing time to reduce the influence of a power noise.

Figure 6:
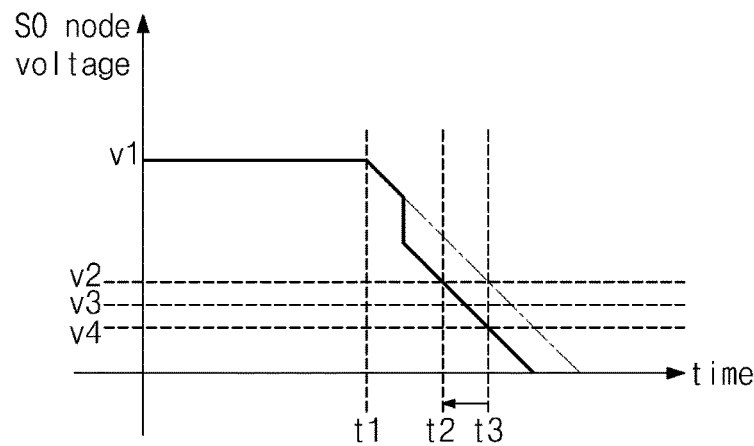
FIG. 6 is a graph illustrating a voltage change of a sensing node of a page buffer circuit over time.

FIG. 6 is a graph illustrating a voltage change of a sensing node of a page buffer circuit over time. The case where the influence of a power noise due to a data output operation causes a voltage drop of a sensing node will be described with reference to FIG. 6. In FIG. 6, a horizontal axis represents a time, and a vertical axis represents a voltage of a sensing node. The sensing node will be more fully described with reference to FIG. 11.

Referring to FIGS. 2 and 6, a dash-single dotted line in the graph of FIG. 6 shows an operating characteristic of the sensing node in the case where there is no influence of a power noise. For example, the dash-single dotted line of the graph of FIG. 6 shows a voltage of the sensing node in the case where data are not output during the sensing operation. A solid line of the graph of FIG. 6 shows an operating characteristic of the sensing node in the case where the nonvolatile memory device 120 has an influence of a power noise. For example, the solid line of the graph of FIG. 6 shows a voltage of the sensing node in the case where data are output during the sensing operation.

In the case where a power noise does not occur, at a third time t3, a voltage of the sensing node may have a second voltage value v2. In contrast, in the case where a power noise occurs, at the third time t3, a voltage of the sensing node may have a fourth voltage value v4. For example, a power noise may occur as the sensing operation and the data output operation overlap each other, and a voltage of the sensing node may decrease due to the power noise. Note that ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

The voltage drop of the sensing node due to the power noise may cause a sensing error. For example, to read data stored in the memory cell array 122, the nonvolatile memory device 120 may sense a voltage of the sensing node at a specific time and may store a logical value corresponding to a state of the sensing node in the page buffer circuit 124.

In an exemplary embodiment, the nonvolatile memory device 120 may sense a voltage of the sensing node at the third time t3 based on a third voltage value v3 and may store a logical value corresponding to a state of the sensing node in the page buffer circuit 124. When the voltage of the sensing node at the third time t3 is greater than the third voltage value v3, a first logical value may be stored in the page buffer circuit 124. When the voltage of the sensing node at the third time t3 is smaller than the third voltage value v3, a second logical value may be stored in the page buffer circuit 124.

In an exemplary embodiment, in the case of the dash-single dotted line, a voltage of the sensing node at the third time t3 has the second voltage value v2 greater than the third voltage value v3. Accordingly, the nonvolatile memory device 120 may store the first logical value in the page buffer circuit 124. In contrast, in the case of the solid line, a voltage of the sensing node at the third time t3 has the fourth voltage value v4 smaller than the third voltage value v3. Accordingly, the nonvolatile memory device 120 may store the second logical value in the page buffer circuit 124. In the case where the sensing operation and the data output operation overlap each other, the nonvolatile memory device 120 may store the first logical value but may read the second logical value due to the power noise. That is, a sensing error may occur.

In an exemplary embodiment, to prevent the sensing error, the nonvolatile memory device 120 according to an embodiment of the inventive concept may adjust the sensing time. In the case of the solid line, the nonvolatile memory device 120 may sense a voltage of the sensing node at the second time t2 advanced with respect to the third time t3 and may store a logical value corresponding to a state of the sensing node in the page buffer circuit 124. In the case of the solid line, a voltage of the sensing node at the second time t2 has the second voltage value v2 greater than the third voltage value v3. Accordingly, the nonvolatile memory device 120 may store the first logical value in the page buffer circuit 124. Therefore, even though a power noise occurs, the nonvolatile memory device 120 may adjust a sensing time to prevent a sensing error.

Figure 7:
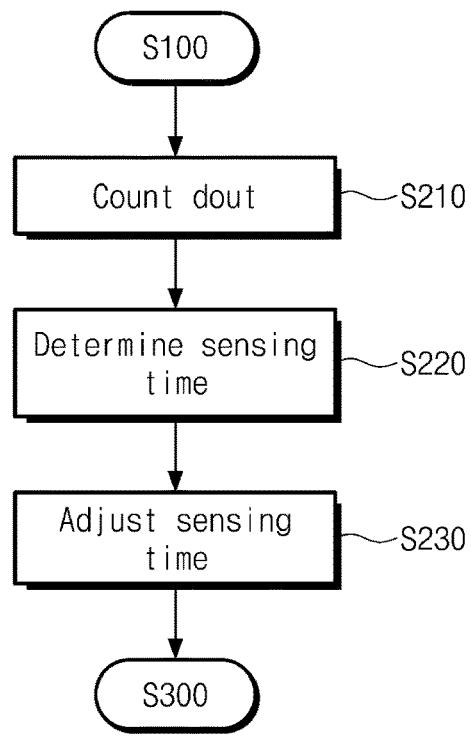
FIG. 7 is a flowchart illustrating operation S200 of FIG. 4 in detail, according to an embodiment of the inventive concept.

FIG. 7 is a flowchart illustrating operation S200 of FIG. 4 in detail, according to an embodiment. Referring to FIGS. 2, 4, and 7, in operation S100, the nonvolatile memory device 120 performs the sensing operation for a page at the page buffer circuit 124 and determines whether the data output operation is simultaneously being performed at the input/output circuit 125. In the case where the data output operation is performed while the sensing operation is performed, the nonvolatile memory device 120 performs operation S200. Operation S200 may include operation S210 to operation S230.

In operation S210, the nonvolatile memory device 120 counts a data output during the data output operation. As a count value of the data output increases, the influence of a power noise on the sensing operation may increase. To check the degree of the influence of the power noise, the nonvolatile memory device 120 may count the data output.

In an exemplary embodiment, the nonvolatile memory device 120 may count a data strobe signal or a column address. The nonvolatile memory device 120 may output data through data lines in synchronization with a rising edge and a falling edge of the data strobe signal. Accordingly, to count the data output, the nonvolatile memory device 120 may count the number of times that the data strobe signal transitions. For example, the number of times of a rising edge and a falling edge of the data strobe signal may be counted.

The address ADDR received from the memory controller 110 may include a row address and a column address. The column address may indicate a size of data to be transmitted to the memory controller 110. For example, the nonvolatile memory device 120 may count the data output through the column address.

In an exemplary embodiment, the input/output circuit 125 may transmit information about a data output count to the sensing time control circuit 121. Alternatively, the sensing time control circuit 121 may receive the data strobe signal or the column address from the input/output circuit 125 to obtain the information about the data output count. For example, the sensing time control circuit 121 may extract a data output count value during the data output operation based on the number of times of a transition of the data strobe signal and/or based on the column address.

In operation S220, the sensing time control circuit 121 of the nonvolatile memory device 120 determines a sensing time. For example, the sensing time control circuit 121 may determine the sensing time based on the information about the data output count received from the input/output circuit 125. For example, the sensing time control circuit 121 may make the sensing time shorter than the default sensing time. In an exemplary embodiment, as a count value of the data output increases, the sensing time control circuit 121 may make the sensing time shorter.

In operation S230, the sensing time control circuit 121 may adjust the sensing time based on the determined sensing time. In an exemplary embodiment, the sensing time control circuit 121 may transmit a sensing end signal to the page buffer circuit 124. The sensing end signal may indicate that the adjusted sensing time from a start of the sensing operation has passed.

Figure 8:
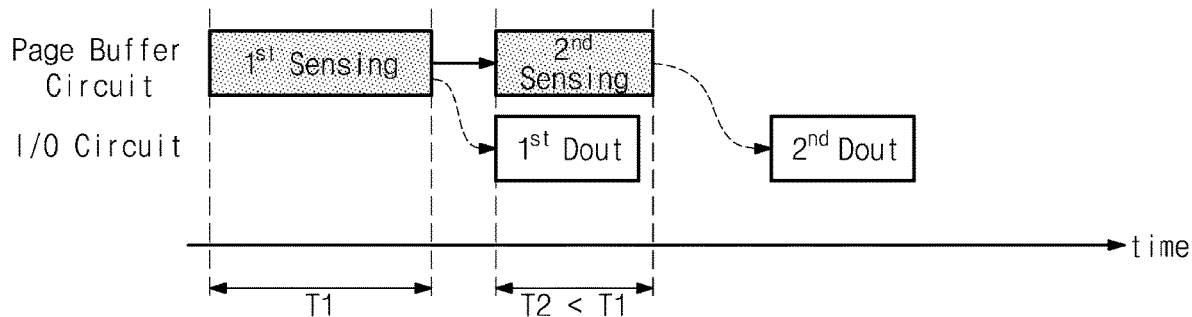
FIG. 8 is a timing diagram illustrating an operation of a nonvolatile memory device.

FIG. 8 is a timing diagram illustrating an operation of a nonvolatile memory device. A method of adjusting a sensing time to compensate for a power noise will be described with reference to FIGS. 2 and 8. The nonvolatile memory device 120 may perform a sensing operation $1^{st}$ Sensing for a first page at the page buffer circuit 124. Afterwards, the nonvolatile memory device 120 may perform a sensing operation $2^{nd}$ Sensing for a second page at the page buffer circuit 124. The nonvolatile memory device 120 may perform a data output operation $1^{st}$ Dout for the first page at the input/output circuit 125. Afterwards, the nonvolatile memory device 120 may perform a data output operation $2^{nd}$ Dout for the second page at the input/output circuit 125.

The nonvolatile memory device 120 may perform the data output operation $1^{st}$ Dout for the first page after performing the sensing operation $1^{st}$ Sensing for the first page. The nonvolatile memory device 120 may perform the data output operation $2^{nd}$ Dout for the second page after performing the sensing operation $2^{nd}$ Sensing for the second page.

The nonvolatile memory device 120 may perform the data output operation $1^{st}$ Dout for the first page in parallel with (e.g., concurrently with) the sensing operation $2^{nd}$ Sensing for the second page. That is, the sensing operation $2^{nd}$ Sensing for the second page and the data output operation $1^{st}$ Dout for the first page may overlap each other.

A power noise may occur due to the data output operation $1^{st}$ Dout for the first page, and a sensing error may occur during the sensing operation $2^{nd}$ Sensing for the second page due to the power noise. The sensing time control circuit 121 may adjust the sensing time (e.g., sensing duration, also described as sensing time duration) during the sensing operation $2^{nd}$ Sensing for the second page, in particular, may reduce a sensing time (e.g., duration) to compensate for a power noise. The sensing operation $1^{st}$ sensing for the first page may be performed during a first time (e.g., time period) T1. To compensate for a power noise, the sensing time control circuit 121 may adjust a sensing time such that the sensing operation $2^{nd}$ Sensing for the second page is performed during a second time (e.g., time period) T2 shorter than the first time (e.g., time period) T1.

Figure 9:
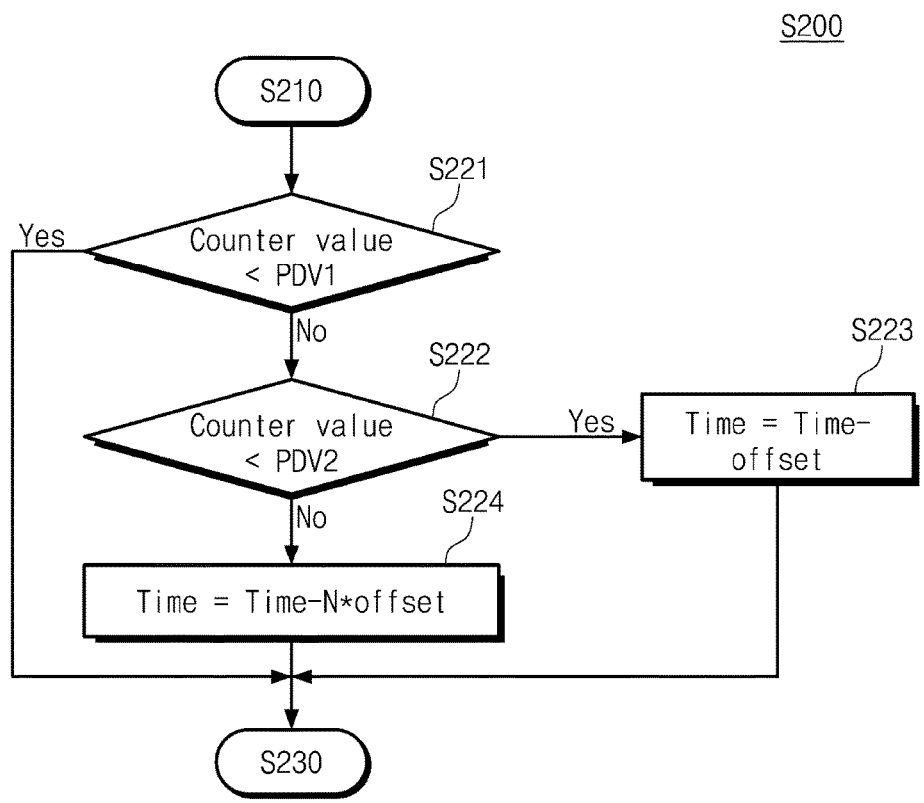
FIG. 9 is a flowchart illustrating operation S220 of FIG. 7 in detail, according to an embodiment of the inventive concept.

FIG. 9 is a flowchart illustrating operation S220 of FIG. 7 in detail. A method of determining a sensing time will be described with reference to FIGS. 2, 7, and 9. The sensing time control circuit 121 may extract a data output count value during a data output operation based on the number of times of a transition of a data strobe signal or a column address.

In operation S221, the sensing time control circuit 121 compares a count value of the data output to a first predetermined value PDV1. When the data output count value is smaller than the first predetermined value PDV1, the sensing time control circuit 121 may proceed to operation S230. In this situation, the sensing time control circuit 121 does not adjust a sensing time, which results in a sensing operation being performed according to and during the default sensing time. When the data output count value is equal to or greater than the first predetermined value PDV1, the sensing time control circuit 121 may proceed to operation S222.

In operation S222, the sensing time control circuit 121 may compare the data output count value with a second predetermined value PDV2. When the data output count value is smaller than the second predetermined value PDV2, the sensing time control circuit 121 may proceed to operation S223. When the data output count value is equal to or greater than the second predetermined value PDV2, the sensing time control circuit 121 may proceed to operation S224.

When the data output count value is equal to or greater than the first predetermined value PDV1 and is smaller than the second predetermined value PDV2, in operation S223, the sensing time control circuit 121 may decrease the sensing time from the default sensing time as much as an offset. Afterwards, the sensing time control circuit 121 may proceed to operation S230.

When the data output count value is equal to or greater than the second predetermined value PDV2, in operation S224, the sensing time control circuit 121 may decrease the sensing time from the default sensing time as much as M times an offset (N being a positive number greater than 1). However, the inventive concept is not limited thereto. The sensing time adjusted in operation S224 may be smaller than the sensing time adjusted in operation S223. Afterwards, the nonvolatile memory device 120 may proceed to operation S230.

In an exemplary embodiment, the first predetermined value PDV1 may be smaller than the second predetermined value PDV2. When the data output count value is smaller than the first predetermined value PDV1, the influence of a power noise may be ignorable. For this reason, in one embodiment, the sensing time control circuit 121 does not adjust the sensing time, resulting in the sensing operation being performed for the default sensing time duration. When the data output count value is equal to or greater than the first predetermined value PDV1 and is smaller greater than the second predetermined value PDV2, to minimize the influence of a power noise, the sensing time control circuit 121 may decrease the sensing time from the default sensing time. When the data output count value is equal to or greater than the second predetermined value PDV2, the influence of a power noise may increase. For this reason, to further decrease the sensing time, the sensing time control circuit 121 may decrease the sensing time from the default sensing time as much as N times an offset (N being a positive number).

Figure 10:
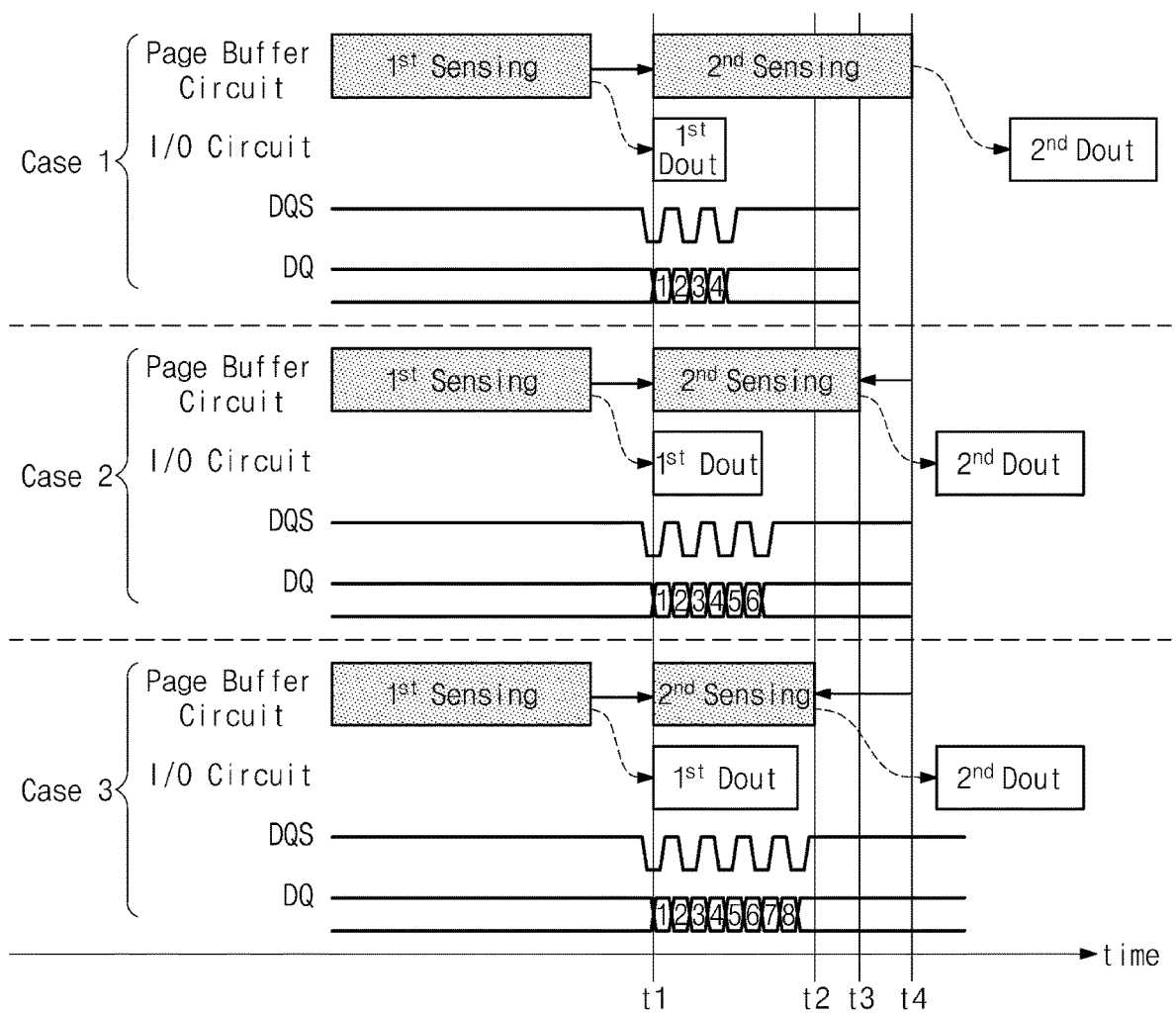
FIG. 10 is a timing diagram illustrating an operation of a nonvolatile memory device.

FIG. 10 is a timing diagram illustrating an operation of a nonvolatile memory device. A method of adjusting a sensing time based on a data output count value will be described with reference to FIGS. 2, 9, and 10. For brevity of illustration, some control signals will be omitted.

The nonvolatile memory device 120 may perform a sensing operation $1^{st}$ Sensing for a first page at the page buffer circuit 124. Afterwards, the nonvolatile memory device 120 may perform a sensing operation $2^{nd}$ Sensing for a second page at the page buffer circuit 124. The nonvolatile memory device 120 may perform a data output operation $1^{st}$ Dout for the first page at the input/output circuit 125. Afterwards, the nonvolatile memory device 120 may perform a data output operation $2^{nd}$ Dout for the second page at the input/output circuit 125. The nonvolatile memory device 120 may perform the data output operation $1^{st}$ Dout for the first page after performing the sensing operation $1^{st}$ Sensing for the first page. The nonvolatile memory device 120 may perform the data output operation $2^{nd}$ Dout for the second page after performing the sensing operation $2^{nd}$ Sensing for the second page.

The nonvolatile memory device 120 may perform the data output operation $1^{st}$ Dout for the first page in parallel with the sensing operation $2^{nd}$ Sensing for the second page. For example, the sensing operation $2^{nd}$ Sensing for the second page and the data output operation $1^{st}$ Dout for the first page may overlap each other and may be performed concurrently, for at least part of both operations.

A power noise may occur due to the data output operation $1^{st}$ Dout for the first page, and a sensing error may occur during the sensing operation $2^{nd}$ Sensing for the second page due to the power noise. To reduce the sensing error, the sensing time control circuit 121 may adjust the sensing time such that the sensing time decreases.

In an exemplary embodiment, the nonvolatile memory device 120 may output data through data lines DQ in synchronization with a rising edge and a falling edge of a data strobe signal DQS. In FIG. 10, CASE 1 indicates the case where a data output count value during the data output operation $1^{st}$ Dout for the first page is 4, CASE 2 indicates the case where the data output count value during the data output operation $1^{st}$ Dout for the first page is 6, and CASE 3 indicates the case where the data output count value during the data output operation $1^{st}$ Dout for the first page is 8.

In CASE 1, because the data output count value associated with the first page is the smallest, a time when the sensing operation $2^{nd}$ Sensing for the second page and the data output operation $1^{st}$ Dout for the first page overlap each other may be the shortest. In contrast, in CASE 3, because the data output count value associated with the first page is the greatest, a time when the sensing operation $2^{nd}$ Sensing for the second page and the data output operation $1^{st}$ Dout for the first page overlap each other may be the longest.

As an overlapping time duration of the sensing operation and the data output operation increases, the influence of the power noise may increase. Accordingly, to compensate for the power noise, as a data output count value increases, the sensing time control circuit 121 may make a sensing time of the sensing operation shorter.

In CASE 1, the nonvolatile memory device 120 may perform the sensing operation $2^{nd}$ Sensing for the second page from a first time t1 to a fourth time t4 (e.g., between the first time t1 and the fourth time t4 to have a time duration of t4−t1). In CASE 2, the nonvolatile memory device 120 may perform the sensing operation $2^{nd}$ Sensing for the second page from the first time t1 to a third time t3 (e.g., between the first time t1 and the third time t3 to have a time duration of t3−t1). Because the data output count value of CASE 2 is more than that of CASE 1 as much as 2, the sensing time control circuit 121 may make the sensing time of the sensing operation $2^{nd}$ Sensing for the second page shorter than that of CASE 1.

In CASE 3, the nonvolatile memory device 120 may perform the sensing operation $2^{nd}$ Sensing for the second page from the first time t1 to a second time t2 (e.g., between the first time t1 and the second time t2 to have a time duration of t2−t1). Because the data output count value of CASE 3 is more than that of CASE 2 as much as 2, the sensing time control circuit 121 may make the sensing time of the sensing operation $2^{nd}$ Sensing of CASE 3 shorter than that of CASE 2. In this manner, a sensing time duration for of the sensing operation $2^{nd}$ Sensing may be shorter than a sensing time duration for the sensing operation $1^{st}$ Sensing, for example, by a predetermined amount (e.g., a predetermined percentage or number of clock signals shorter), which may be controlled by logic circuits of the sensing time control circuit 121. The sensing time of the sensing operation $2^{nd}$ Sensing of CASE 3 may be shorter than the sensing time of the sensing operation $2^{nd}$ Sensing of CASE 2, for example, by a predetermined amount (e.g., a predetermined percentage or number of clock signals shorter), which may be controlled by logic circuits of the sensing time control circuit 121.

In the case where the sensing operation $2^{nd}$ Sensing for the second page and the data output operation $1^{st}$ Dout for the first page overlap each other, as a data output count value associated with the first page increases, a sensing time of the sensing operation $2^{nd}$ Sensing for the second page may decrease.

In an exemplary embodiment, a time interval from the second time t2 to the third time t3 may be equal to a time interval from the third time t3 to the fourth time t4 or may be N times the time interval from the third time t3 to the fourth time t4 (N being a positive number greater than 1). However, the inventive concept is not limited thereto.

As described above, to reduce the influence of the power noise due to the data output operation during the sensing operation, the sensing time control circuit 121 may adjust the sensing time. The sensing time control circuit 121 may adjust the sensing time based on a data output count value. As the data output count value increases, the influence of the power noise may increase. Accordingly, as the data output count value or the influence of the power noise increases, the sensing time control circuit 121 may make the sensing time shorter.

Figure 11:
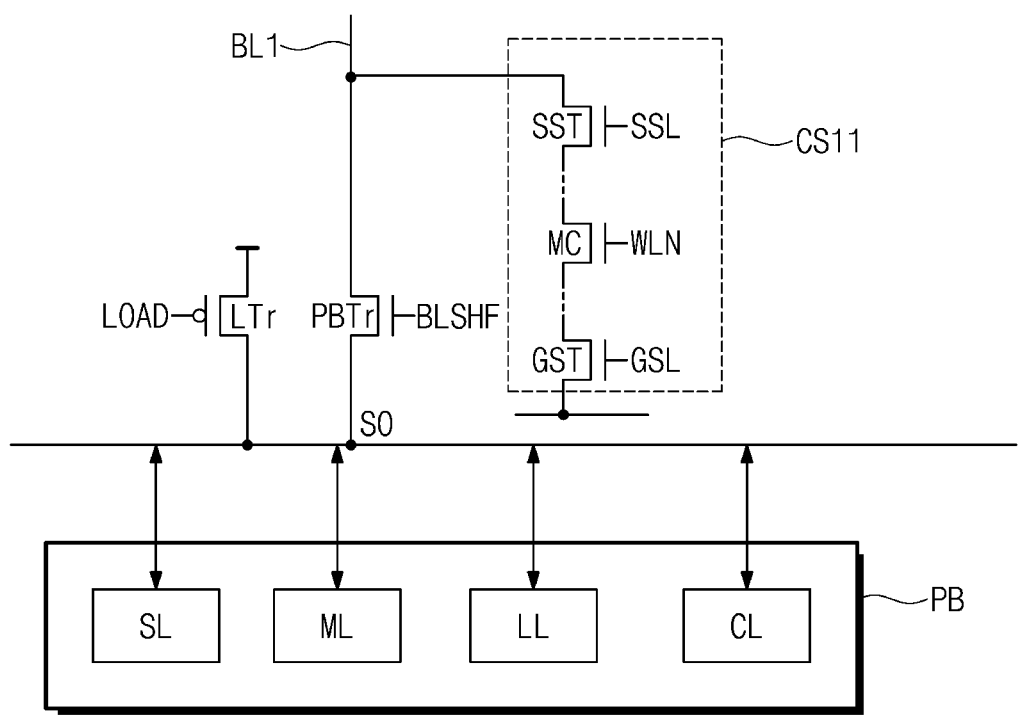
FIG. 11 is a block diagram illustrating a structure of a sensing node of a nonvolatile memory device.

FIG. 11 is a block diagram illustrating an exemplary structure of a sensing node of a nonvolatile memory device. A structure of a sensing node SO will be described with reference to FIGS. 2, 3, and 11. The nonvolatile memory device 120 may include the cell string CS11, the first bit line BL1, a page buffer transistor PBTr, a load transistor LTr, and a page buffer PB. The cell string CS11 may be connected with the first bit line BL1. The cell string CS11 may include a plurality of cell transistors. The plurality of cell transistors may be connected in series between the first bit line BL1 and the common source line CSL. For example, the plurality of cell transistors may include a string selection transistor SST, memory cells MC, and a ground selection transistor GST. The string selection transistor SST may be provided between serially-connected memory cells MC and the first bit line BL1. The ground selection transistor GST may be provided between the serially-connected memory cells MC and the common source line CSL.

The page buffer transistor PBTr may be connected between the first bit line BL1 and the sensing node SO in series. The page buffer transistor PBTr may be turned on in response to a bit line voltage control signal BLSHF. The sensing node SO may be electrically connected with or separated from the first bit line BL1 through the page buffer transistor PBTr controlled by the bit line voltage control signal BLSHF.

The load transistor LTr may be connected between a bias voltage (not illustrated) and the sensing node SO in series. The load transistor LTr may be turned on in response to a load signal LOAD. A precharge voltage may be applied to the sensing node SO through the load transistor LTr controlled by the load signal LOAD. The page buffer PB may include a sensing latch SL, data latches ML and LL, and a cache latch CL, which are connected with the sensing node SO.

Figure 12:
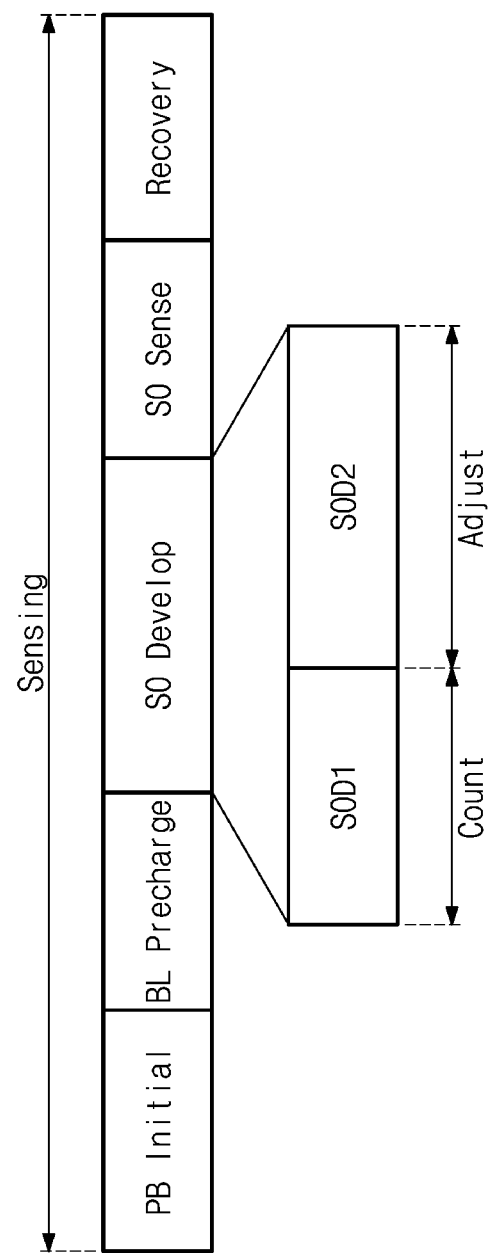
FIG. 12 is a diagram illustrating a sensing operation of a nonvolatile memory device.

FIG. 12 is a diagram illustrating a sensing operation of a nonvolatile memory device. A sensing operation will be described with reference to FIGS. 2, 11, and 12 in detail. The sensing operation may include a page buffer initialization phase (PB Initial), a bit line precharge phase (BL Precharge), a sensing node develop phase (SO Develop), a sensing node sensing phase (SO Sense), and a recovery phase (Recovery).

In the page buffer initialization phase, the nonvolatile memory device 120 may initialize the sensing latch SL of the page buffer PB. In the bit line precharge phase, the nonvolatile memory device 120 may apply a precharge voltage to the sensing node SO and the first bit line BL1 by using the load signal LOAD. In the sensing node develop phase, the nonvolatile memory device 120 may connect the sensing node SO with the first bit line BL1 by using the bit line voltage control signal BLSHF. A voltage of the sensing node SO may vary depending on a potential of the first bit line BL1. In the sensing node sensing phase, sensing data corresponding to the potential of the sensing node SO may be stored in the sensing latch SL. In the recovery phase, the nonvolatile memory device 120 may discharge voltages of transistors maintained in previous phases.

To read data stored in a selected memory cell MC, a read voltage may be applied to a selected word line WLN. When a threshold voltage of the selected memory cell MC connected with the first bit line BL1 connected with the page buffer PB is greater than the read voltage, for example, when the selected memory cell MC is in a program state, the selected memory cell MC may be turned off. Accordingly, the precharged voltage of the first bit line BL1 may be maintained. Afterwards, the nonvolatile memory device 120 may connect the sensing node SO with the first bit line BL1 by using the bit line voltage control signal BLSHF. When the selected memory cell MC is an off-cell, it may be difficult to discharge charges on the sensing node SO to the common source line CSL through the first bit line BL1. Accordingly, because the amount of current flowing from the sensing node SO to the first bit line BL1 is relatively small, a speed at which a voltage of the sensing node SO decreases may be relatively slow. In this case, the voltage of the sensing node SO may be maintained almost uniformly.

When the threshold voltage of the selected memory cell MC connected with the first bit line BL1 connected with the page buffer PB is equal to or smaller than the read voltage, for example, when the selected memory cell MC is in an erase state, the selected memory cell MC may be turned on. Accordingly, the precharged voltage of the first bit line BL1 may be discharged to a ground level. Afterwards, the nonvolatile memory device 120 may connect the sensing node SO with the first bit line BL1 by using the bit line voltage control signal BLSHF. When the selected memory cell MC is an on-cell, charges on the sensing node SO may be discharged to the common source line CSL through the first bit line BL1. In this case, because the amount of current flowing from the sensing node SO to the first bit line BL1 is relatively high, a speed at which a voltage of the sensing node SO decreases may be relatively fast.

Also, the graph of FIG. 6 shows a voltage change of the sensing node SO when the selected memory cell MC is in an erase state. A voltage of the sensing node SO precharged to the first voltage value v1 may be discharged from the first time t1. As the sensing operation and the data output operation overlap each other, the voltage of the sensing node SO may decrease. In this case, an off-cell may be determined as an on-cell.

For example, the nonvolatile memory device 120 may sense a voltage of the sensing node SO at the third time t3 based on the third voltage value v3 and may store a logical value corresponding to a state of the sensing node in the sensing latch SL. When the voltage of the sensing node SO is greater than the third voltage value v3 at the third time t3, the selected memory cell MC may be determined as an off-cell, and thus, a first logical value may be latched by the sensing latch SL. In contrast, when the voltage of the sensing node SO is smaller than the third voltage value v3 at the third time t3, the selected memory cell MC may be determined as an on-cell, and thus, a second logical value may be latched by the sensing latch SL.

In an exemplary embodiment, in the case of the dash-single dotted line, the voltage of the sensing node SO at the third time t3 has the second voltage value v2 greater than the third voltage value v3. Accordingly, the selected memory cell MC may be determined as an off-cell, and thus, the first logical value may be latched by the sensing latch SL. In contrast, in the case of the solid line, the voltage of the sensing node SO at the third time t3 has the fourth voltage value v4 smaller than the third voltage value v3. Accordingly, the selected memory cell MC may be determined as an on-cell, and thus, the second logical value may be latched by the sensing latch SL. According to the above description, when the sensing operation and the data output operation overlap each other, the voltage of the sensing node SO may decrease due to the influence of a power noise of the data output operation. As such, not the first logical value but the second logical value may be latched by the sensing latch SL. That is, a sensing error may occur.

In an exemplary embodiment, to prevent the sensing error, the nonvolatile memory device 120 may adjust the sensing time. A time to latch may be advanced by decreasing a run time of the sensing node develop phase of the sensing operation. In the case of the solid line, that is, in the case where the sensing operation and the data output operation overlap each other, the nonvolatile memory device 120 may sense a voltage of the sensing node SO at the second time t2 advanced with respect to the third time t3 and may store a logical value corresponding to a state of the sensing node SO in the sensing latch SL. In the case of the solid line, a voltage of the sensing node SO at the second time t2 has the second voltage value v2 greater than the third voltage value v3. Accordingly, the selected memory cell MC may be determined as an off-cell, and thus, the first logical value may be latched by the sensing latch SL. As a result, even though a power noise occurs, the nonvolatile memory device 120 may adjust the sensing time and may correctly sense an off-cell as an off-cell.

In an exemplary embodiment, the sensing node develop phase (SO Develop) may include a first sensing node develop phase SOD1 and a second sensing node develop phase SOD2. In the first sensing node develop phase SOD1, the nonvolatile memory device 120 may count a data output. In the second sensing node develop phase SOD2, the nonvolatile memory device 120 may adjust a sensing time based on the data output count value. In detail, the nonvolatile memory device 120 may decrease a run time of the second sensing node develop phase SOD2. The run time of the first sensing node develop phase SOD1 may be fixed, but the run time of the second sensing node develop phase SOD2 may vary depending on a data output count value, and therefore, may be variable.

Figure 13:
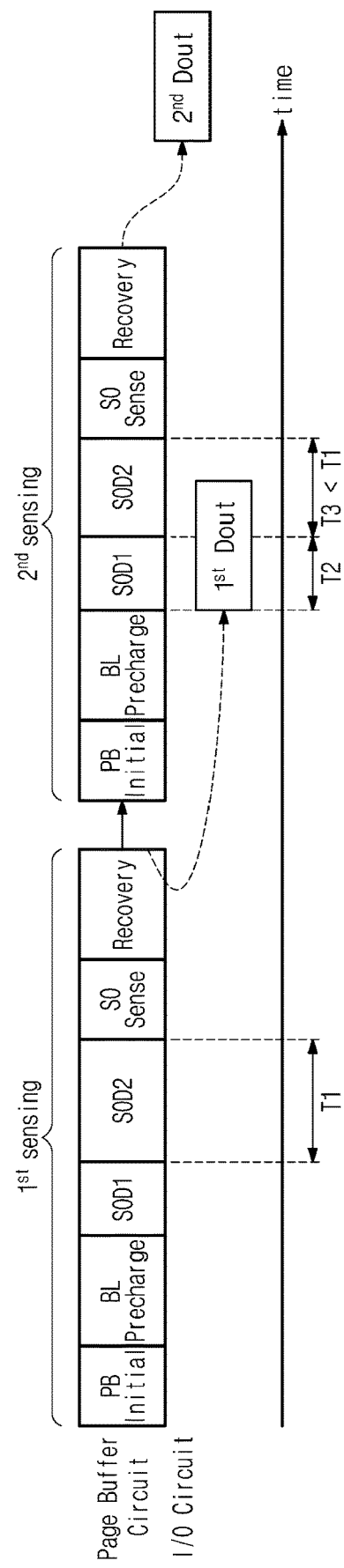
FIG. 13 is a timing diagram illustrating an operation of a nonvolatile memory device.

FIG. 13 is a timing diagram illustrating an operation of a nonvolatile memory device. The case where the sensing node develop phase and the data output operation Dout overlap each other during the sensing operation will be described with reference to FIGS. 2, 11, 12, and 13. The sensing operation and the data output operation of FIG. 13 are similar or identical to those described with reference to FIG. 8, and thus, additional description will be omitted to avoid redundancy.

Each of the sensing operation $1^{st}$ Sensing for the first page and the sensing operation $2^{nd}$ Sensing for the second page may include the page buffer initialization phase (PB Initial), the bit line precharge phase (BL Precharge), the first sensing node develop phase SOD1, the second sensing node develop phase SOD2, the sensing node sensing phase (SO Sense), and the recovery phase (Recovery).

In the sensing operation $1^{st}$ sensing for the first page, the nonvolatile memory device 120 may perform the second sensing node develop phase SOD2 during a first time T1. Afterwards, the nonvolatile memory device 120 may perform the data output operation $1^{st}$ Dout for the first page at the input/output circuit 125 at the same time as performing the sensing operation $2^{nd}$ Sensing for the second page. In the first sensing node develop phase SOD1 of the sensing operation $2^{nd}$ Sensing for the second page, the nonvolatile memory device 120 may count the data output operation $1^{st}$ Dout for the first page in parallel during a second time T2. Based on the data output count value, the nonvolatile memory device 120 may perform the second sensing node develop phase SOD2 of the sensing operation $2^{nd}$ Sensing for the second page during a third time T3 shorter than the first time T1.

The nonvolatile memory device 120 may reduce the influence of the power noise due to the data output operation $1^{st}$ Dout for the first page by decreasing a run time of the second sensing node develop phase SOD2 of the sensing operation $2^{nd}$ Sensing for the second page.

Figure 14:
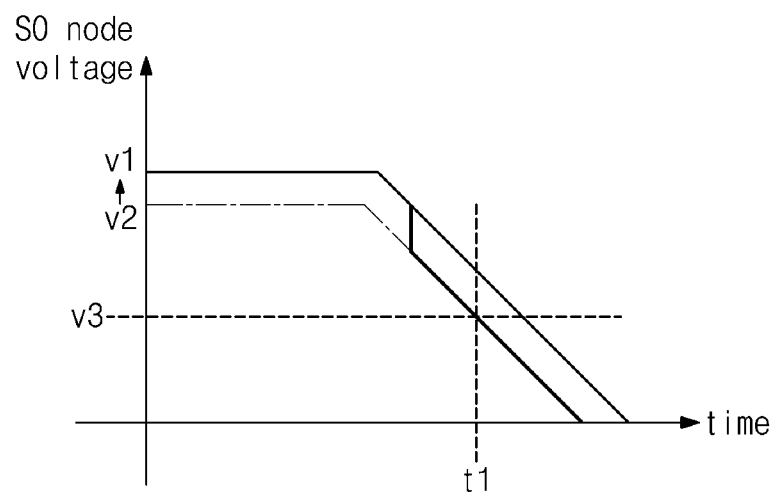
FIG. 14 is a graph illustrating a voltage change of a sensing node of a page buffer circuit over time.

FIG. 14 is a graph illustrating a voltage change of a sensing node of a page buffer circuit over time. A method of adjusting a voltage of a sensing node such that power noise influence is minimized will be described with reference to FIGS. 2, 11, 12, and 14. In FIG. 14, a horizontal axis represents a time, and a vertical axis represents a voltage of a sensing node. Like FIG. 6, when the sensing operation and the data output operation overlap each other, a voltage of a sensing node may decrease due to power noise influence.

A dash-single dotted line shows an operating characteristic of the sensing node when a precharge voltage of the sensing node has a second voltage value v2 without the power noise influence. A solid line shows an operating characteristic of the sensing node when a precharge voltage of the sensing node has a first voltage value v1 without the power noise influence. A bold line shows an operating characteristic of the sensing node when a precharge voltage has the first voltage value v1 with the power noise influence exerted.

In the case of the dash-single dotted line, at a first time t1, a voltage of the sensing node has a third voltage value v3. In the case of the bold line, at the first time t1, a voltage of the sensing node has the third voltage value v3. That is, a power noise may occur as the sensing operation (or, in detail, a sensing node develop phase of the sensing operation) and the data output operation overlap each other, thereby causing a voltage drop of the sensing node. In this case, the nonvolatile memory device 120 may increase the precharge voltage of the sensing node. As a result, even though a power noise occurs, at a specific time, a voltage of the sensing node may be equal or similar to that when a power noise does not occur. Accordingly, the nonvolatile memory device 120 may prevent a sensing error.

Figure 15:
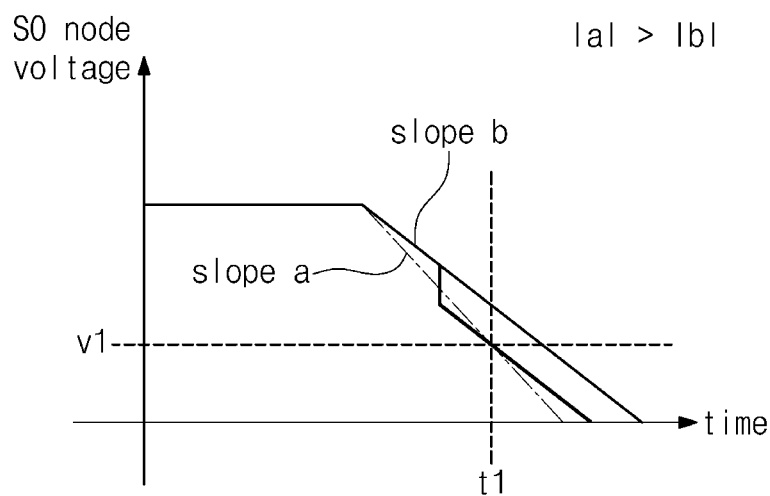
FIG. 15 is a graph illustrating a voltage change of a sensing node of a page buffer circuit over time.

FIG. 15 is a graph illustrating a voltage change of a sensing node of a page buffer circuit over time. A method of adjusting the bit line voltage control signal BLSHF provided to a gate of the page buffer transistor PBTr such that power noise influence is minimized will be described with reference to FIGS. 2, 11, 12, and 15. In FIG. 15, a horizontal axis represents a time, and a vertical axis represents a voltage of a sensing node. Like FIG. 6, when the sensing operation and the data output operation overlap each other, a voltage of a sensing node may decrease due to power noise influence.

A dash-single dotted line shows an operating characteristic of the sensing node when a voltage of the bit line voltage control signal BLSHF is high without power noise influence. A solid line shows an operating characteristic of the sensing node when a voltage of the bit line voltage control signal BLSHF is small without power noise influence. A bold line shows an operating characteristic of the sensing node when a voltage of the bit line voltage control signal BLSHF is small with power noise influence exerted.

In the case of the dash-single dotted line, a slope of a voltage of the sensing node is "a". In the case of the solid line and the bold line, a slope of a voltage of the sensing node is "b". An absolute value of the slope of the dash-single dotted line is greater than an absolute value of the slope of the solid line and the bold line ($|a|>|b|$). In the case of the dash-single dotted line, at a first time t1, a voltage of the sensing node has a first voltage value v1. In the case of the bold line, at the first time t1, a voltage of the sensing node has the first voltage value v1. A power noise may occur as the sensing operation (or, in detail, a sensing node develop phase of the sensing operation) and the data output operation overlap each other, thereby causing a voltage drop of the sensing node. In this case, the nonvolatile memory device 120 may decrease a voltage of the bit line voltage control signal BLSHF. For example, the nonvolatile memory device 120 may decrease an absolute value of a voltage slope of the sensing node. As a result, even though a power noise occurs, at a specific time, a voltage of the sensing node may be equal or similar to that when a power noise does not occur. Accordingly, the nonvolatile memory device 120 may prevent a sensing error.

Figure 16:
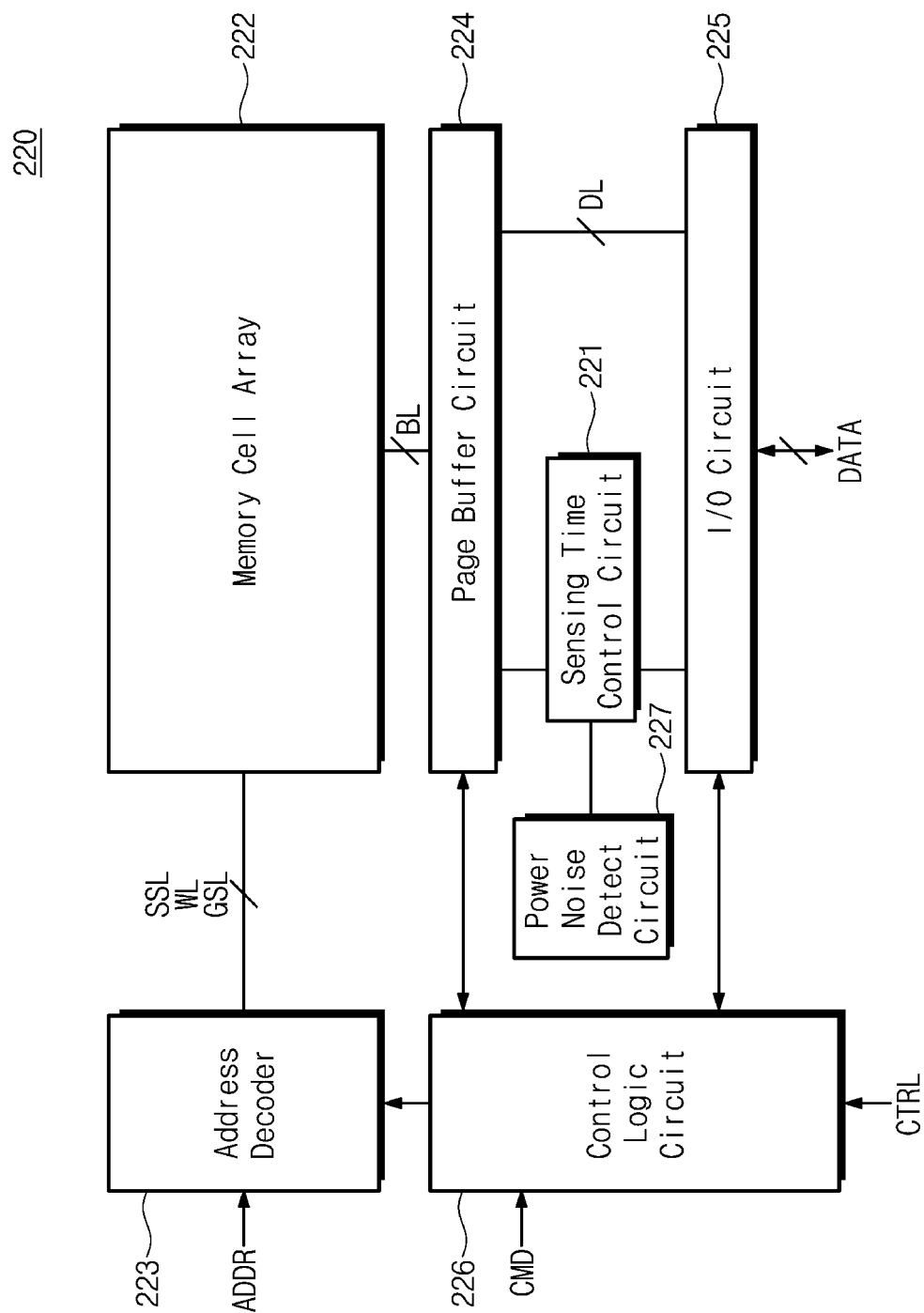
FIG. 16 is a block diagram illustrating a nonvolatile memory device of FIG. 1, according to an embodiment of the inventive concept.

FIG. 16 is a block diagram illustrating a nonvolatile memory device of FIG. 1, according to an example embodiment. A nonvolatile memory device 220 may include a sensing time control circuit 221, a memory cell array 222, an address decoder 223, a page buffer circuit 224, an input/output circuit 225, a control logic circuit 226, and a power noise detect circuit 227. The components 222 to 226 correspond to the components 122 to 126 described with reference to FIG. 2, and thus, additional description will be omitted to avoid redundancy.

When the sensing operation and the data output operation overlap each other, the power noise detect circuit 227 (also described as a power noise detection circuit) may detect a direction of a power noise due to a data output. That is, in the case where the data output operation is performed while the sensing operation is performed, the power noise detect circuit 227 may detect a voltage change of the sensing node SO of the page buffer circuit 224 due to the power noise. For example, the power noise detect circuit 227 may determine whether a voltage of the sensing node SO increases or decreases due to the power noise influence.

In an exemplary embodiment, the power noise detect circuit 227 may provide the sensing time control circuit 221 with a power noise signal including information about a direction of the voltage change of the sensing node SO. The voltage change direction information about the sensing node SO may include information about whether a voltage of the sensing node SO increases or decreases due to the power noise influence. For example, the case where the power noise signal provided from the power noise detect circuit 227 to the sensing time control circuit 221 is logical high may indicate that a voltage of the sensing node SO increases due to the power noise influence. The case where the power noise signal provided from the power noise detect circuit 227 to the sensing time control circuit 221 is logical low may indicate that a voltage of the sensing node SO decreases due to the power noise influence.

When the data output operation is performed at the input/output circuit 225 while the sensing operation is performed at the page buffer circuit 224, the sensing time control circuit 221 may adjust a sensing time to compensate for the power noise influence due to the data output operation. A direction to adjust a sensing time may be determined based on the direction of the voltage change of the sensing node. Unlike the embodiments described above in connection with FIG. 2, the sensing time control circuit 221 may increase or decrease the sensing time in response to the power noise signal of the power noise detect circuit 227.

In an exemplary embodiment, the case where the power noise signal that is received from the power noise detect circuit 227 and includes the voltage change direction information of the sensing node SO is logical high may indicate that a voltage of the sensing node SO increases due to the power noise influence. In this case, the sensing time control circuit 221 may increase the sensing time. The case where the power noise signal received from the power noise detect circuit 227 is logical low may indicate that a voltage of the sensing node SO decreases due to the power noise influence. In this case, the sensing time control circuit 221 may decrease the sensing time.

Figure 17:
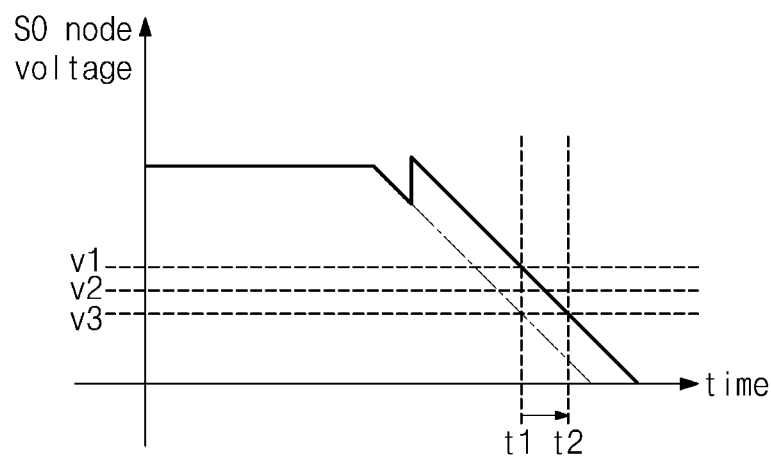
FIG. 17 is a graph illustrating a voltage change of a sensing node of a page buffer circuit over time.

FIG. 17 is a graph illustrating a voltage change of a sensing node of a page buffer circuit over time. The case where the influence of a power noise due to a data output operation causes a voltage increase of a sensing node will be described with reference to FIGS. 11, 16, and 17. In FIG. 17, a horizontal axis represents a time, and a vertical axis represents a voltage of a sensing node.

A dash-single dotted line shows an operating characteristic of the sensing node in the case where there is no power noise influence. A solid line shows an operating characteristic of the sensing node in the case where power noise influence exists.

In the case where a power noise does not occur, at a first time t1, a voltage of the sensing node has a third voltage value v3. In contrast, in the case where a power noise occurs, at the first time t1, a voltage of the sensing node has a first voltage value v1. That is, a power noise may occur as the sensing operation (or, in detail, a sensing node develop phase of the sensing operation) and the data output operation overlap each other, thereby causing a voltage increase of the sensing node.

The voltage increase of the sensing node due to the power noise may cause a sensing error. For example, the nonvolatile memory device 220 may sense a voltage of the sensing node at a first time t1 based on a second voltage value v2 and may store a logical value corresponding to a state of the sensing node in the page buffer PB. When the voltage of the sensing node at the first time t1 is greater than the second voltage value v2, a first logical value may be stored in the page buffer circuit 124. When the voltage of the sensing node at the first time t1 is smaller than the second voltage value v2, a second logical value may be stored in the page buffer circuit 124.

In an exemplary embodiment, in the case of the dash-single dotted line, a voltage of the sensing node at the first time t1 has a third voltage value v3 smaller than the second voltage value v2. Accordingly, the nonvolatile memory device 120 may store the second logical value in the sensing latch SL. In contrast, in the case of the solid line, a voltage of the sensing node at the first time t1 has a first voltage value v1 greater than the second voltage value v2. Accordingly, the nonvolatile memory device 120 may store the first logical value in the sensing latch SL. In the case where the sensing operation and the data output operation overlap each other, the nonvolatile memory device 120 may store the second logical value but may read the first logical value due to the power noise. In this case, an on-cell may be determined as an off-cell. That is, a sensing error may occur.

In an exemplary embodiment, to prevent the sensing error, the nonvolatile memory device 120 may adjust the sensing time. In the case of the solid line, the nonvolatile memory device 120 may sense a voltage of the sensing node at the second time t2 delayed with respect to the first time t1 and may store a logical value corresponding to a state of the sensing node in the sensing latch SL. In the case of the solid line, a voltage of the sensing node at the second time t2 has the third voltage value v3 smaller than the second voltage value v2. Accordingly, the nonvolatile memory device 120 may store the second logical value in the sensing latch SL. That is, even though a power noise occurs, the nonvolatile memory device 120 may adjust the sensing time to prevent a sensing error.

In the case where a power noise occurs as the sensing operation and the data output operation overlap each other, a power noise direction of FIG. 17 is opposite to a power noise direction of FIG. 6. FIG. 6 may show the case where a power noise occurs in a direction where a voltage of the sensing node decreases, and FIG. 17 may show the case where a power noise occurs in a direction where a voltage of the sensing node increases. Accordingly, to reduce the power noise influence, a nonvolatile memory device according to an embodiment of FIG. 6 may decrease a sensing time, and the nonvolatile memory device 220 according to an embodiment of FIG. 17 may increase a sensing time to compensate for the power noise influence.

Figure 18:
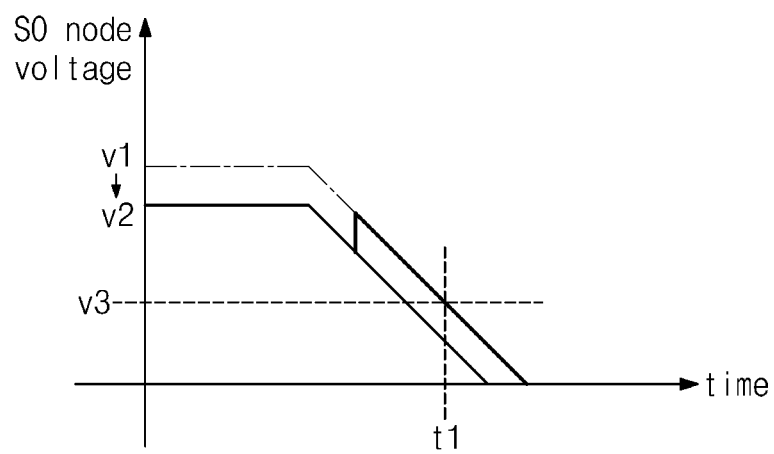
FIG. 18 is a graph illustrating a voltage change of a sensing node of a page buffer circuit over time.

FIG. 18 is a graph illustrating a voltage change of a sensing node of a page buffer circuit over time. A method of adjusting a voltage of a sensing node such that power noise influence is minimized will be described with reference to FIGS. 11, 16, and 18. In FIG. 18, a horizontal axis represents a time, and a vertical axis represents a voltage of a sensing node. Like FIG. 17, when the sensing operation and the data output operation overlap each other, a voltage of a sensing node may increase due to power noise influence.

A dash-single dotted line shows an operating characteristic of the sensing node when a precharge voltage of the sensing node has a first voltage value v1 without the power noise influence. A solid line shows an operating characteristic of the sensing node when a precharge voltage of the sensing node has a second voltage value v2 without the power noise influence. A bold line shows an operating characteristic of the sensing node when a precharge voltage of the sensing node has the second voltage value v2 with the power noise influence exerted.

In the case of the dash-single dotted line, at a first time t1, a voltage of the sensing node has a third voltage value v3. In the case of the bold line, at the first time t1, a voltage of the sensing node has the third voltage value v3. That is, a power noise may occur as the sensing operation (or, in detail, a sensing node develop phase of the sensing operation) and the data output operation overlap each other, thereby causing a voltage increase of the sensing node. In this case, the nonvolatile memory device 220 may decrease the precharge voltage of the sensing node. As a result, even though a power noise occurs, at a specific time, a voltage of the sensing node may be equal or similar to that when a power noise does not occur. That is, the nonvolatile memory device 220 may prevent a sensing error.

In the case where a power noise occurs as the sensing operation and the data output operation overlap each other, a power noise direction of FIG. 18 is opposite to a power noise direction of FIG. 14. FIG. 14 may show the case where a power noise occurs in a direction where a voltage of the sensing node decreases, and FIG. 18 may show the case where a power noise occurs in a direction where a voltage of the sensing node increases. Accordingly, to reduce the power noise influence, a nonvolatile memory device according to an embodiment of FIG. 14 may increase a precharge voltage of a sensing node, and the nonvolatile memory device 220 according to an embodiment of FIG. 18 may decrease a precharge voltage of a sensing node to minimize the power noise influence.

Figure 19:
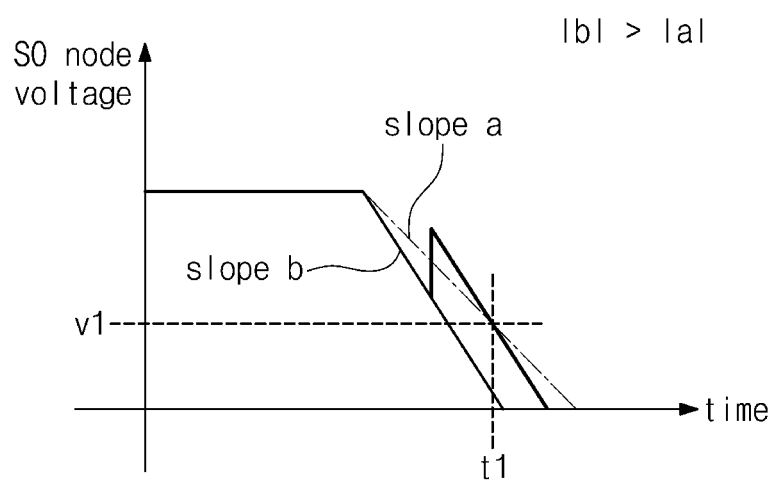
FIG. 19 is a graph illustrating a voltage change of a sensing node of a page buffer circuit over time.

FIG. 19 is a graph illustrating a voltage change of a sensing node of a page buffer circuit over time. A method of adjusting the bit line voltage control signal BLSHF provided to a gate of the page buffer transistor PBTr such that power noise influence is minimized will be described with reference to FIGS. 11, 16, and 19. In FIG. 19, a horizontal axis represents a time, and a vertical axis represents a voltage of a sensing node. Like FIG. 17, when the sensing operation and the data output operation overlap each other, a voltage of a sensing node may increase due to power noise influence.

A dash-single dotted line shows an operating characteristic of the sensing node when a voltage of the bit line voltage control signal BLSHF is small without power noise influence. A solid line shows an operating characteristic of the sensing node when a voltage of the bit line voltage control signal BLSHF is high without power noise influence. A bold line shows an operating characteristic of the sensing node when a voltage of the bit line voltage control signal BLSHF is high with power noise influence exerted.

In the case of the dash-single dotted line, a slope of a voltage of the sensing node has "a". In the case of the solid line and the bold line, a slope of a voltage of the sensing node has "b". An absolute value of the slope of the dash-single dotted line is smaller than an absolute value of the slop of the solid line and the bold line (|a|<|b|). In the case of the dash-single dotted line, at a first time t1, a voltage of the sensing node has a first voltage value v1. In the case of the bold line, at the first time t1, a voltage of the sensing node has the first voltage value v1. That is, a power noise may occur as the sensing operation (or, in detail, a sensing node develop phase of the sensing operation) and the data output operation overlap each other, thereby causing a voltage increase of the sensing node. In this case, the nonvolatile memory device 220 may increase a voltage of the bit line voltage control signal BLSHF. That is, the nonvolatile memory device 220 may increase an absolute value of a voltage slope of the sensing node. As a result, even though a power noise occurs, at a specific time, a voltage of the sensing node may be equal or similar to that when a power noise does not occur. That is, the nonvolatile memory device 220 may prevent a sensing error.

In the case where a power noise occurs as the sensing operation and the data output operation overlap each other, a power noise direction of FIG. 19 is opposite to a power noise direction of FIG. 15. FIG. 15 shows the case where a power noise occurs in a direction where a voltage of the sensing node decreases, and FIG. 19 shows the case where a power noise occurs in a direction where a voltage of the sensing node increases. Accordingly, to reduce the power noise influence, a nonvolatile memory device according to an embodiment of FIG. 15 may decrease a voltage of the bit line voltage control signal BLSHF (or may decrease a voltage slope of a sensing node), and the nonvolatile memory device 220 according to an embodiment of FIG. 19 may increase a voltage of the bit line voltage control signal BLSHF (or may increase a voltage slope of a sensing node). As such, the power noise influence may be minimized.

Figure 20:
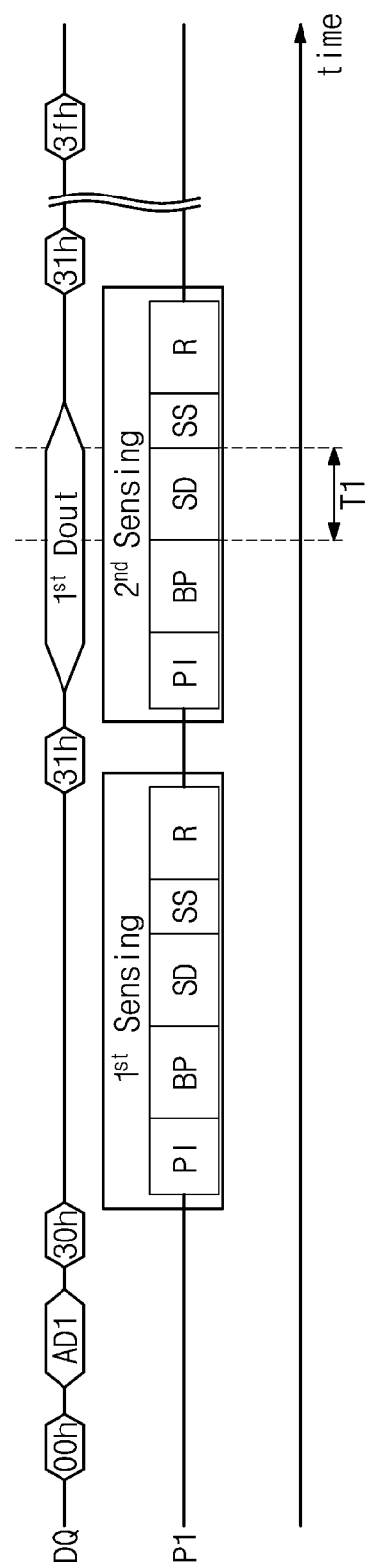
FIG. 20 is a timing diagram illustrating an operation of a nonvolatile memory device.

FIG. 20 is a timing diagram illustrating an operation of a nonvolatile memory device. How a sensing error occurs due to a power noise as the sensing operation and the data output operation overlap each other during a cache read operation of the nonvolatile memory device 120 will be described with reference to FIGS. 2, 12, and 20. For brevity of illustration, some control signals will be omitted.

The nonvolatile memory device 120 may receive "ooh" during a command input interval through the data lines DQ. Afterwards, the nonvolatile memory device 120 may receive addresses AD1 during an address input interval through the data lines DQ. The addresses AD1 may include a row address or a column address of a physical page corresponding to a page where read data are stored.

Afterwards, the nonvolatile memory device 120 may receive "30h" during a command input interval through the data lines DQ. In response to the "30h" command, the nonvolatile memory device 120 may read data (or first cache data) of a first page corresponding to the received addresses AD1 from the memory cell array 122. For example, the nonvolatile memory device 120 may perform a sensing operation $1^{st}$ Sensing for the first page. As described above, the sensing operation $1^{st}$ Sensing for the first page may include a page buffer initialization phase PI, a bit line precharge phase BP, a sensing node develop phase SD, a sensing node sensing phase SS, and a recovery phase "R".

Afterwards, the nonvolatile memory device 120 may receive "31h" during a command input interval. In response to the "31h" command, the nonvolatile memory device 120 may perform a data output operation $1^{st}$ Dout for the first page. For example, the nonvolatile memory device 120 may output the data of the first page (or the first cache data) through the data lines DQ. At the same time, the nonvolatile memory device 120 may perform a sensing operation $2^{nd}$ Sensing for a second page different from the first page.

As described above, the sensing operation $2^{nd}$ Sensing for the second page may include the page buffer initialization phase PI, the bit line precharge phase BP, the sensing node develop phase SD, the sensing node sensing phase SS, and the recovery phase "R". The nonvolatile memory device 120 may perform the sensing node develop phase SD during a first time T1. During the first time T1, the nonvolatile memory device 120 may perform the sensing node develop phase SD and may simultaneously output the data of the first page (or the first cache data) through the data lines DQ. Due to the influence of a power noise due to the data output operation $1^{st}$ Dout for the first page, a sensing error may occur while the sensing node develop phase SD is performed.

Afterwards, the nonvolatile memory device 120 may further receive "31h" during a command input interval. In response to the "31h" command, the nonvolatile memory device 120 may output data of the second page (or second cache data) previously read through the data lines DQ. At the same time, a sensing operation (not illustrated) may be performed on a third page. Afterwards, the nonvolatile memory device 120 may receive "3f" during a command input interval and may perform a data output operation (not illustrated) for the third page in response to the "3f" command. That is, the nonvolatile memory device 120 may output data of the third page (or third cache data) through the data lines DQ. In an exemplary embodiment, each of the first to third cache data may be single page data.

During the cache read operation of the nonvolatile memory device 120, as the first cache data output operation $1^{st}$ Dout and the second cache data sensing operation $2^{nd}$ Sensing overlap each other, a sensing error may occur during the sensing operation $2^{nd}$ Sensing of the second cache data due to power noise influence. In detail, in the case where the nonvolatile memory device 120 performs the sensing node develop phase SD of the sensing operation $2^{nd}$ Sensing for the second cache data, that is, the second page by using the page buffer circuit 124 and simultaneously performs the data output operation $1^{st}$ Dout for the first page by using the input/output circuit 125, a sensing error may occur during the sensing operation $2^{nd}$ Sensing for the second page due to power noise influence.

Figure 21:
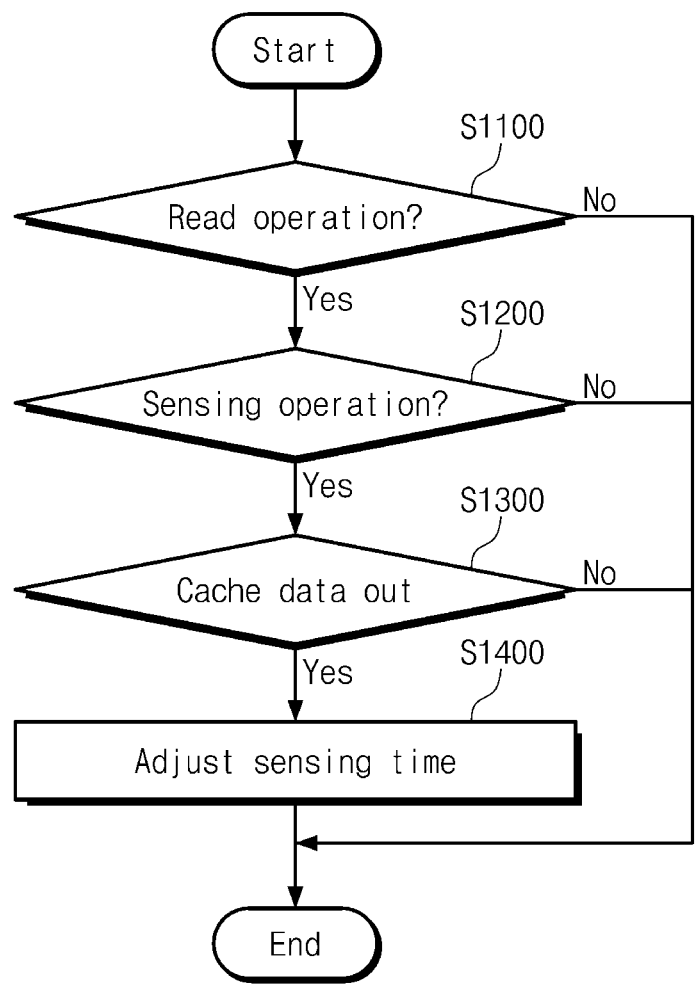
FIG. 21 is a flowchart illustrating an operation of a nonvolatile memory device according to an embodiment of the inventive concept.

FIG. 21 is a flowchart illustrating an operation of a nonvolatile memory device according to an embodiment of the inventive concept. A method of reducing power noise influence when the sensing operation and the data output operation overlap each other during a cache read operation will be described with reference to FIGS. 2, 20, and 21. In operation S1100, the nonvolatile memory device 120 may determine whether a command received from the memory controller 110 is associated with a read request. When it is determined that the received command is associated with the read request, the nonvolatile memory device 120 performs operation S1200. When it is determined that the received command is not associated with the read request, the nonvolatile memory device 120 may not adjust a sensing time.

In operation S1200, the nonvolatile memory device 120 determines whether a sensing operation is being performed at the page buffer circuit 124. When it is determined that the sensing operation is not performed at the page buffer circuit 124, the nonvolatile memory device 120 does not adjust a sensing time. When it is determined that the sensing operation is performed, the nonvolatile memory device 120 performs operation S1300.

In operation S1300, the nonvolatile memory device 120 determines whether a data output operation is being performed at the input/output circuit 125. When it is determined that the data output operation is not performed, the nonvolatile memory device 120 does not adjust a sensing time. When it is determined that the data output operation is performed, the nonvolatile memory device 120 performs operation S1400.

In operation S1400, the nonvolatile memory device 120 may adjust a sensing time of the sensing operation for the purpose of reducing power noise influence due to the data output operation. A method of adjusting a sensing time is in detail described above, and thus, additional description will be omitted to avoid redundancy.

In an exemplary embodiment, to reduce power noise influence due to a data output operation performed during a sensing operation, the nonvolatile memory device 120 may operate based on the operating method described with reference to FIGS. 1 to 19 in addition to the sensing time adjusting scheme.

Figure 22:
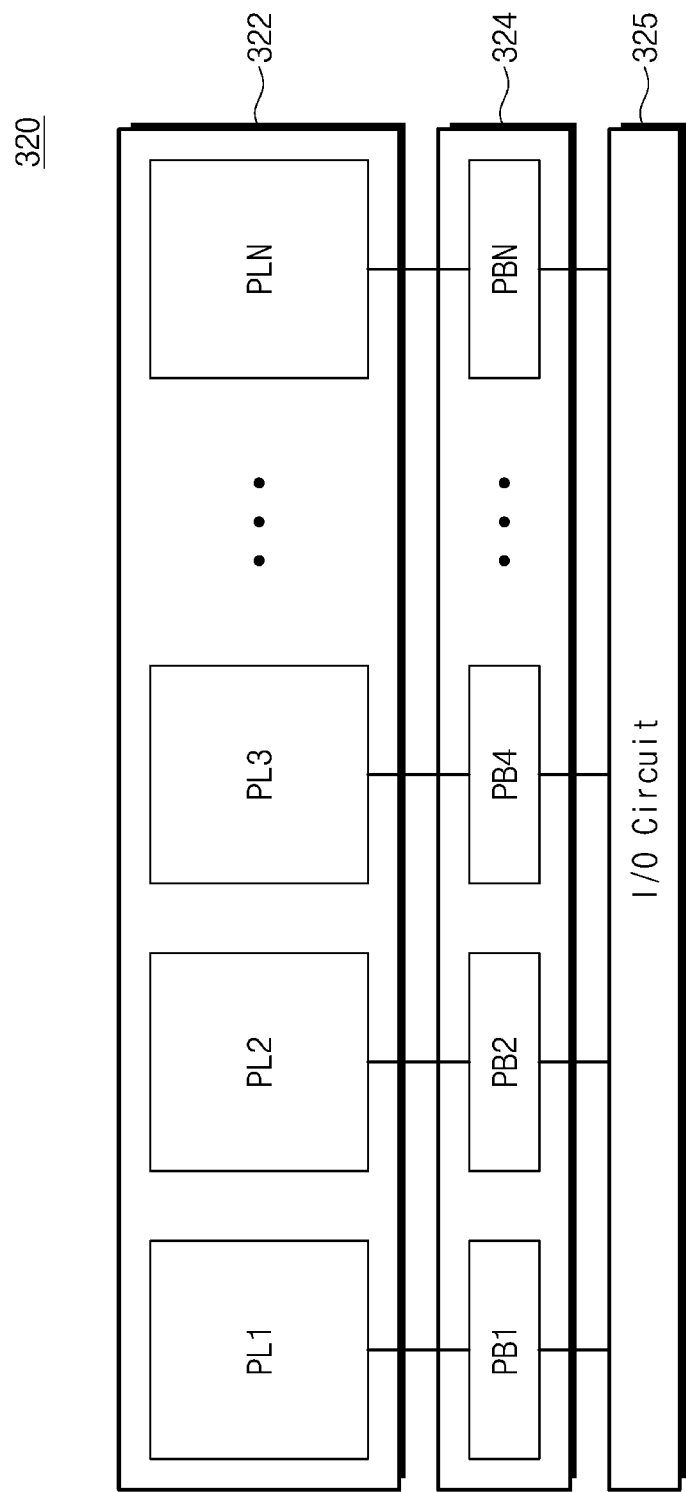
FIG. 22 is a block diagram of a nonvolatile memory device according to an embodiment of the inventive concept.

FIG. 22 is a block diagram of a nonvolatile memory device according to an embodiment of the inventive concept. A nonvolatile memory device 320 including a plurality of planes will be described with reference to FIG. 22. For brevity of illustration, components unnecessary for description will be omitted. The nonvolatile memory device 320 may include a memory cell array 322, a page buffer circuit 324, and an input/output circuit 325.

The memory cell array 322 may include first to N-th planes PL1 to PLN. Each of the first to N-th planes PL1 to PLN may include a plurality of memory blocks. A memory block is described above, and thus, additional description will be omitted to avoid redundancy. Each of the first to N-th planes PL1 to PLN may be connected with one page buffer through bit lines. For example, the first plane PL1 may be connected with a first page buffer PB1 through a first bit line. The second plane PL2 may be connected with a second page buffer PB2 through a second bit line. The remaining planes PL3 to PLN are similar to the first and second planes PL1 and PL2 described above, and thus, additional description will be omitted to avoid redundancy.

The page buffer circuit 324 may include the plurality of page buffers PB1 to PBN. The first to N-th page buffers PB1 to PBN may be connected with the first to N-th planes PL1 to PLN, respectively.

The input/output circuit 325 may be connected with the memory cell array 322 through the page buffer circuit 324 and may exchange data with a memory controller (not illustrated).

In a plane independent read (PIR) mode, the nonvolatile memory device 320 may perform specific operations on the plurality of planes PL1 to PLN, independently of each other or in parallel. Accordingly, the nonvolatile memory device 320 may perform a sensing operation on the second plane PL2 while performing a sensing operation on the first plane PL1.

Figure 23:
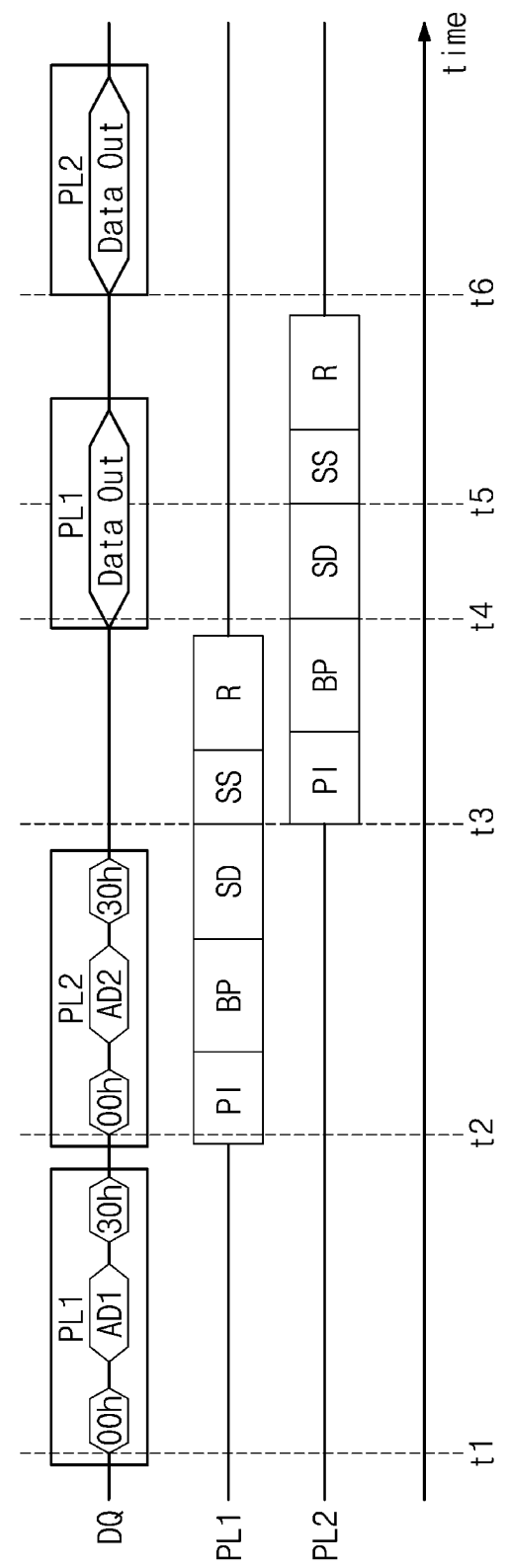
FIG. 23 is a timing diagram illustrating an operation of a nonvolatile memory device according to an embodiment of the inventive concept.

FIG. 23 is a timing diagram illustrating an operation of a nonvolatile memory device according to an embodiment of the inventive concept. The case where the sensing node develop phase SD of a sensing operation for the second plane PL2 and a data output operation Data Out for the first plane PL1 overlap each other will be described with reference to FIGS. 12, 22, and 23. For brevity of illustration, some control signals will be omitted. The nonvolatile memory device 320 may enable the PIR mode depending on a request of the memory controller 110.

At a first time t1, the nonvolatile memory device 320 receives a read request for the first plane PL1. The nonvolatile memory device 320 receives "00h" during a command input interval. Afterwards, the nonvolatile memory device 320 receives addresses AD1 during an address input interval. Afterwards, the nonvolatile memory device 320 receives "30h" during a command input interval.

Afterwards, at a second time t2, the nonvolatile memory device 320 receives a read request for the second plane PL2 during a command input interval. The nonvolatile memory device 320 receives "00h" during a command input interval. Afterwards, the nonvolatile memory device 320 receives addresses AD2 during an address input interval. Afterwards, the nonvolatile memory device 320 receives "30h" during a command input interval.

At the second time t2, while receiving the read request for the second plane PL2, the nonvolatile memory device 320 performs the sensing operation for the first plane PL1 in response to the "30h" command for the first plane. As described above, the sensing operation may include the page buffer initialization phase PI, the bit line precharge phase BP, the sensing node develop phase SD, the sensing node sensing phase SS, and the recovery phase R. At a third time t3, the nonvolatile memory device 320 performs the sensing operation for the second plane PL2 in response to the "30h" command for the second plane.

Afterwards, at a fourth time t4, the nonvolatile memory device 320 outputs data of the first plane PL1 through the data lines DQ. At the same time, from the fourth time t4 to a fifth time t5, the nonvolatile memory device 320 performs the sensing node develop phase SD of the sensing operation for the second plane PL2. As the sensing node develop phase SD of the sensing operation for the second plane PL2 and the data output operation Data Out for the first plane PL1 overlap each other, a sensing error associated with the second plane PL2 may occur due to power noise influence.

Afterwards, when the sensing operation for the second plane PL2 is completed, at a sixth time t6, the nonvolatile memory device 320 outputs data of the second plane PL2 through the data lines DQ.

The nonvolatile memory device 320 may include a plurality of planes and may independently perform an operation for each plane. A data output operation for the first plane PL1 and a sensing operation for the second plane PL2 may overlap each other. In detail, the data output operation for the first plane PL1 and a sensing node develop phase of the sensing operation for the second plane PL2 may overlap each other. In this case, a power noise may occur due to the data output operation, thereby causing a sensing error associated with the second plane PL2.

Figure 24:
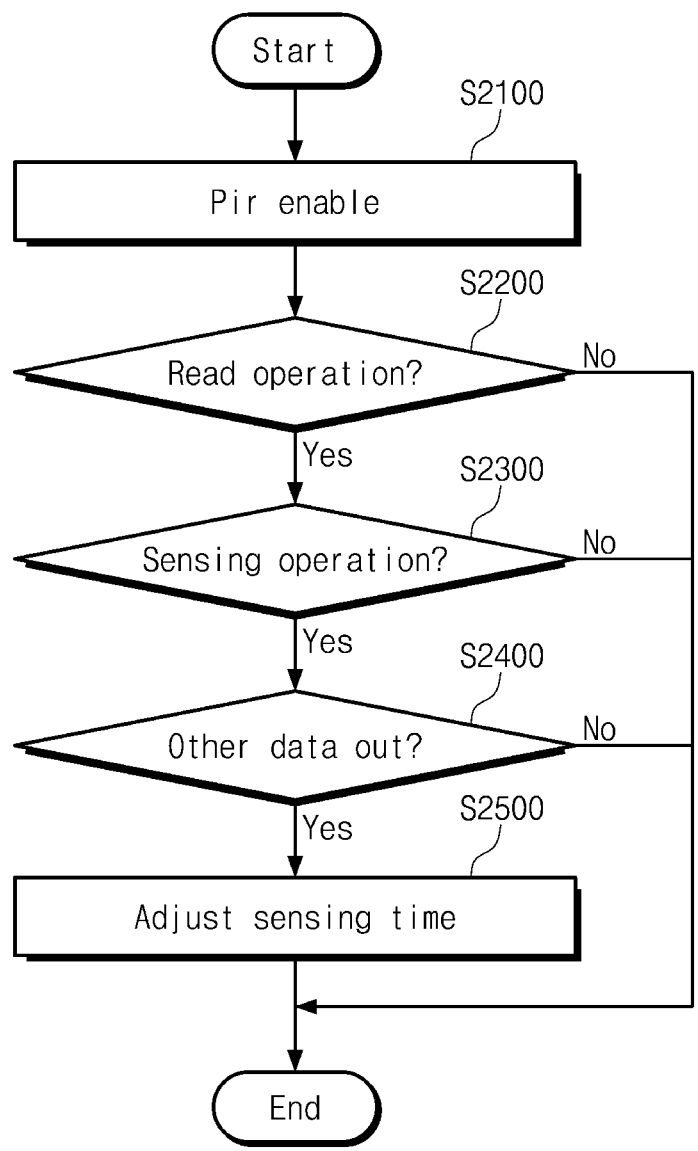
FIG. 24 is a flowchart illustrating an operation of a nonvolatile memory device according to an embodiment of the inventive concept.

FIG. 24 is a flowchart illustrating an operation of a nonvolatile memory device according to the inventive concept. A method of reducing power noise influence when the sensing operation and the data output operation overlap each other in the PIR mode will be described with reference to FIGS. 22, 23, and 24. In operation S2100, the nonvolatile memory device 320 enables the PIR mode depending on a request of the memory controller 110.

In operation S2200, the nonvolatile memory device 320 determines whether a command received from the memory controller 110 is associated with a read request. When it is determined that the received command is associated with the read request, the nonvolatile memory device 320 performs operation S2300. When it is determined that the received command is not associated with the read request, the nonvolatile memory device 320 does not perform adjusting a sensing time.

In operation S2300, the nonvolatile memory device 320 determines whether a sensing operation for the second plane PL2 is being performed. When it is determined that the sensing operation for the second plane PL2 is not performed, the nonvolatile memory device 320 does not perform adjusting a sensing time. When it is determined that the sensing operation for the second plane PL2 is performed, the nonvolatile memory device 320 performs operation S2400.

In operation S2400, the nonvolatile memory device 320 determines whether the data output operation for the first plane PL1 is being performed. When it is determined that the data output operation for the first plane PL1 is not performed, the nonvolatile memory device 320 does not perform adjusting a sensing time. When it is determined that the data output operation for the first plane PL1 is currently performed, the nonvolatile memory device 320 performs operation S2500.

In operation S2500, the nonvolatile memory device 320 adjusts (or trim) a sensing time of the sensing operation for the second plane PL2 for the purpose of reducing power noise influence due to the data output operation for the first plane PL1. A method of adjusting a sensing time is in detail described above, and thus, additional description will be omitted to avoid redundancy.

In an exemplary embodiment, to reduce power noise influence due to a data output operation of a sensing operation, the nonvolatile memory device 320 may operate based on the operating method described with reference to FIGS. 1 to 19 as well as the sensing time adjusting scheme.

Figure 25:
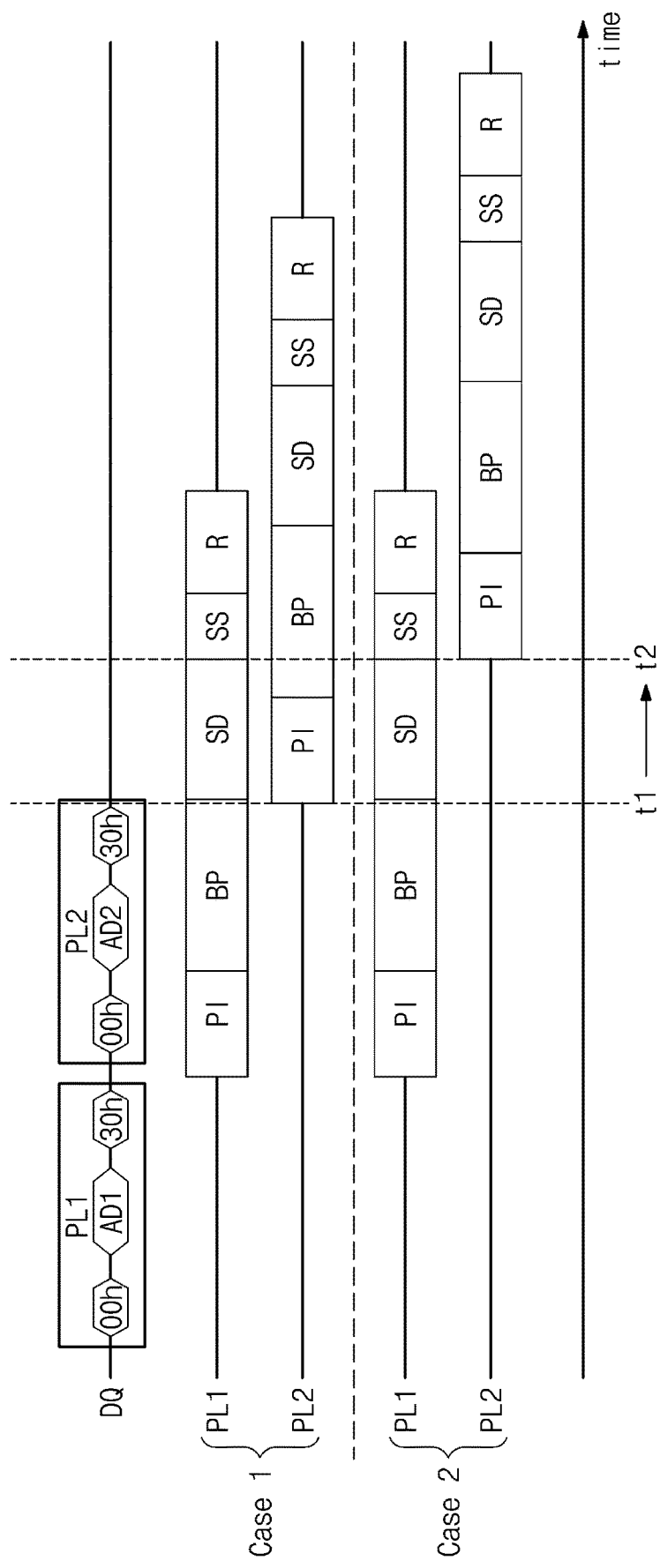
FIG. 25 is a timing diagram illustrating an operation of a nonvolatile memory device according to an embodiment of the inventive concept.

FIG. 25 is a timing diagram illustrating an operation of a nonvolatile memory device according to an embodiment of the inventive concept. A method of reducing power noise influence due to the page buffer initialization phase PI, not a data output operation, while performing the sensing node develop phase SD of a sensing operation will be described with reference to FIGS. 12, 22, and 25.

The nonvolatile memory device 320 may perform operations of a plurality of planes independently of each other or in parallel. Accordingly, the nonvolatile memory device 320 may perform a sensing operation for a first plane PL1 and may simultaneously perform a sensing operation for a second plane PL2. The nonvolatile memory device 320 may perform the page buffer initialization phase PI of the sensing operation for the second plane PL2, not a data output operation, at the same time as performing the sensing node develop phase SD of the sensing operation for the first plane PL1. In this case, because power consumption increases due to the page buffer initialization phase PI, power noise influence may cause a sensing error associated with the first plane PL1.

Like FIG. 23, in the PIR mode, the nonvolatile memory device 320 may receive a cache read request. How addresses and command are received is described with reference to FIG. 23, and thus, additional description will be omitted to avoid redundancy.

While receiving a read request for the second plane PL2, the nonvolatile memory device 320 performs a sensing operation for the first plane PL1 in response to the "30h" command for the first plane PL1. As described above, the sensing operation may include the page buffer initialization phase PI, the bit line precharge phase BP, the sensing node develop phase SD, the sensing node sensing phase SS, and the recovery phase R.

In CASE 1, at a first time t1, the nonvolatile memory device 320 starts the sensing operation for the second plane PL2 in response to the "30h" command for the second plane PL2. As a result, while performing the sensing node develop phase SD of the sensing operation for the first plane PL1, the nonvolatile memory device 320 performs the page buffer initialization phase PI of the sensing operation for the second plane PL2. As such, a power noise may occur as the page buffer initialization phase PI of the sensing operation for the second plane PL2 progresses.

Accordingly, to prevent the sensing node develop phase SD of the sensing operation for the first plane PL1 and the page buffer initialization phase PI of the sensing operation for the second plane PL2 from overlapping each other, the nonvolatile memory device 320 may delay a start of the sensing operation for the second plane PL2.

In CASE 2, at a second time t2, not the first time t1, the nonvolatile memory device 320 may start the sensing operation for the second plane PL2. For example, the nonvolatile memory device 320 may start the sensing operation for the second plane PL2 after completing the sensing node develop phase PI of the sensing operation for the first plane PL1. As a result, the nonvolatile memory device 320 may prevent the page buffer initialization phase PI of the sensing operation for the second plane PL2, which requires large power consumption, and the sensing node develop phase SD of the sensing operation for the first plane PL1 from overlapping each other.

The nonvolatile memory device 320 may enable the PIR mode. Afterwards, the nonvolatile memory device 320 may determine whether a command received from the memory controller 110 is associated with a read request. In the case of the read request, the nonvolatile memory device 320 may determine whether to intend to start a sensing operation in response to the "30h" command for the second plane PL2. In the case of intending to start the sensing operation in response to the "30h" command for the second plane PL2, the nonvolatile memory device 320 may determine whether the sensing node develop phase SD of the sensing operation for the first plane PL1 is currently being performed. When the sensing node develop phase SD of the sensing operation for the first plane PL1 is currently performed, the nonvolatile memory device 320 may delay a start of the page buffer initialization phase PI of the sensing operation for the second plane PL2. After completing the sensing node develop phase SD of the sensing operation for the first plane PL1, the nonvolatile memory device 320 starts the page buffer initialization phase PI of the sensing operation for the second plane PL2.

The nonvolatile memory device 320 may include a plurality of planes and may independently perform an operation for each plane. Instead of a data output operation for a first plane, a sensing operation for the first plane and a sensing operation for a second plane may overlap each other. In detail, a sensing node develop phase of the sensing operation for the first plane and a page buffer initialization phase of the sensing operation for the second plane may overlap each other. In this case, a power noise may occur due to the page buffer initialization phase for the second plane, thereby causing a sensing error associated with the first plane. Accordingly, the nonvolatile memory device 320 may delay a start of the page buffer initialization phase for the second plane until the sensing node develop phase of the sensing operation for the first plane is completed, thus reducing power noise influence.

Figure 26:
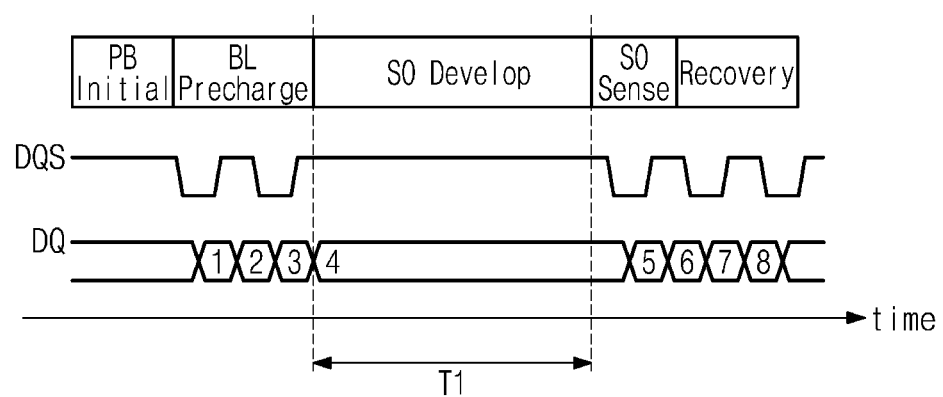
FIG. 26 is a timing diagram illustrating an operation of a nonvolatile memory device according to an embodiment of the inventive concept.

FIG. 26 is a timing diagram illustrating an operation of a nonvolatile memory device according to the inventive concept. Instead of a method of adjusting a sensing time or a voltage of a sensing node, a method of holding a data strobe signal such that a sensing operation and a data output operation do not overlap each other will be described with reference to FIGS. 2, 12, and 26. The nonvolatile memory device 120 outputs data through the data lines DQ in synchronization with a rising edge (↑) and a falling edge (↓) of the data strobe signal DQS. Accordingly, the nonvolatile memory device 120 may suspend a data output by holding the data strobe signal DQS.

In an exemplary embodiment, the nonvolatile memory device 120 may perform a sensing operation by using the page buffer circuit 124 and may simultaneously perform a data output operation by using the input/output circuit 125. In this case, the nonvolatile memory device 120 may hold a transition of the data strobe signal DQS for the purpose of preventing the data output during the sensing operation. For example, while the data strobe signal DQS is held, the nonvolatile memory device 120 does not perform the data output operation, thus reducing power noise influence due to the data output operation.

In an exemplary embodiment, in the case where the sensing operation and the data output operation overlap each other, the nonvolatile memory device 120 may hold a transition of the data strobe signal DQS during a first time T1 while performing a sensing node develop phase SD of the sensing operation. While performing a sensing node develop phase SD of the sensing operation, the nonvolatile memory device 120 may not perform the data output operation, thus reducing power noise influence due to the data output operation.

As explained above, instead of controlling the sensing operation, the nonvolatile memory device 120 may temporarily suspend a data output by holding a data strobe signal DQS for a data output operation. Accordingly, the nonvolatile memory device 120 may prevent the sensing operation and the data output operation from overlapping each other. Alternatively, the nonvolatile memory device 120 may prevent a sensing node develop phase of the sensing operation and the data output operation from overlapping each other. According to the scheme described above, the nonvolatile memory device 120 may reduce power noise influence due to the data output operation, thus preventing a sensing error.

Figure 27:
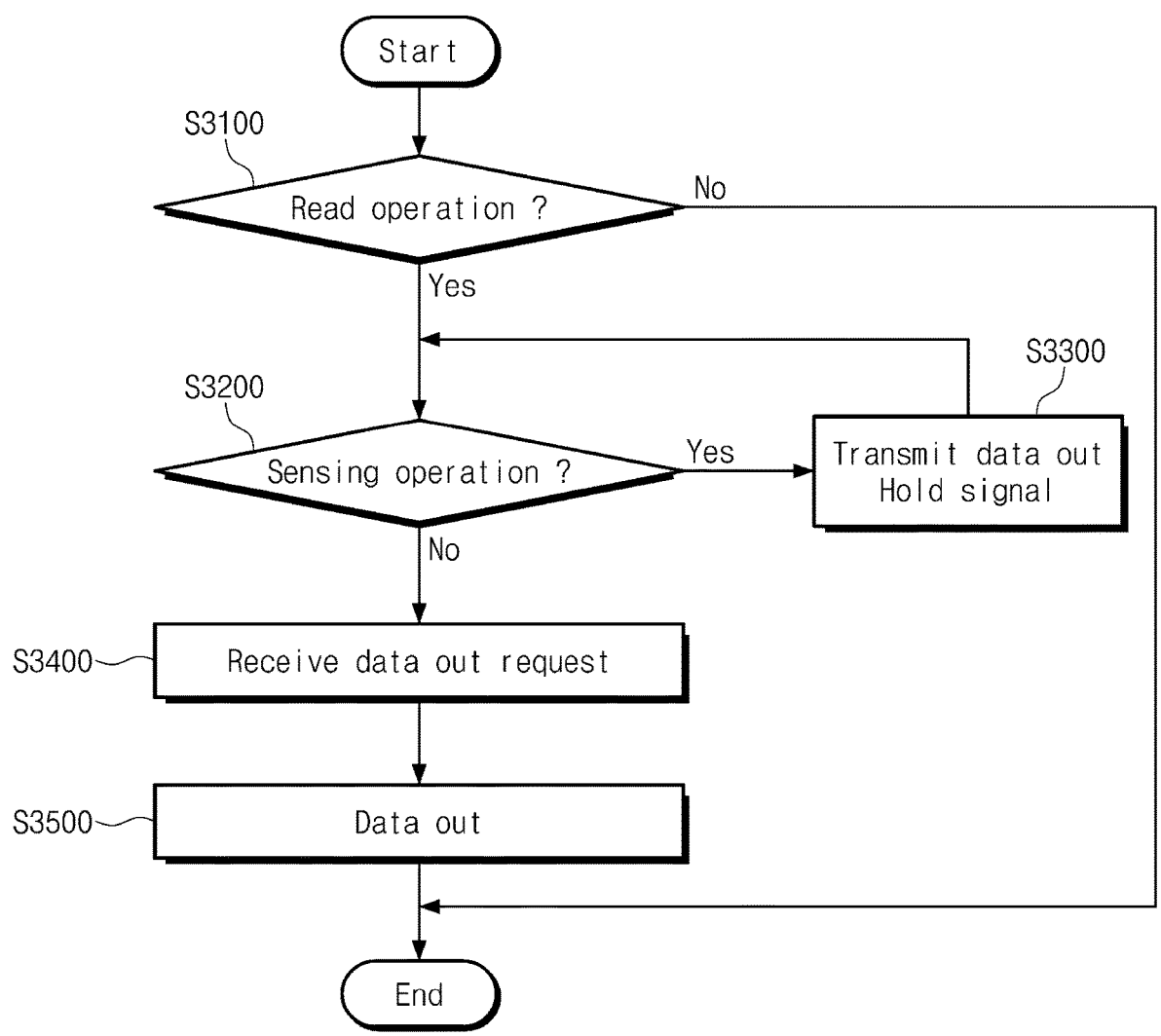
FIG. 27 is a flowchart illustrating an operating method of a nonvolatile memory device according to an embodiment of the inventive concept.

FIG. 27 is a flowchart illustrating an operating method of a nonvolatile memory device according to an embodiment of the inventive concept. In operation S3100, the nonvolatile memory device 120 may determine whether a command received from the memory controller 110 is associated with a read request. When it is determined that the received command is not associated with the read request, the nonvolatile memory device 320 does not output a signal for preventing a data output during a sensing operation. When it is determined that the received command is associated with the read request, the nonvolatile memory device 120 performs operation S3200.

In operation S3200, the nonvolatile memory device 120 determines whether to perform a sensing operation of a current read operation. In the case of performing the sensing operation of the current read operation, the nonvolatile memory device 120 performs operation S3300. In the case of performing no sensing operation, the nonvolatile memory device 120 performs operation S3400.

In operation S3300, the nonvolatile memory device 120 transmit a data out hold signal to the memory controller 110. As the nonvolatile memory device 120 transmits the data out hold signal to the memory controller 110, the nonvolatile memory device 120 may inform the memory controller 110 that a sensing operation is currently being performed. That is, the nonvolatile memory device 120 may request the memory controller 110 to temporarily delay a data output start. Accordingly, it may be possible to prevent data from being output during the sensing operation. This mean that a sensing error due to power noise influence may be prevented. Afterwards, the nonvolatile memory device 120 performs operation S3200.

In operation S3400, the nonvolatile memory device 120 receives a data output request signal from the memory controller 110. For example, the nonvolatile memory device 120 may receive a read enable signal RE #. Afterwards, the nonvolatile memory device 120 performs operation S3500.

In operation S3500, the nonvolatile memory device 120 outputs data. For example, a data output operation temporarily delayed to prevent data from being output during the sensing operation may be performed. For example, the nonvolatile memory device 120 may output data through the data lines DQ.

Figure 28:
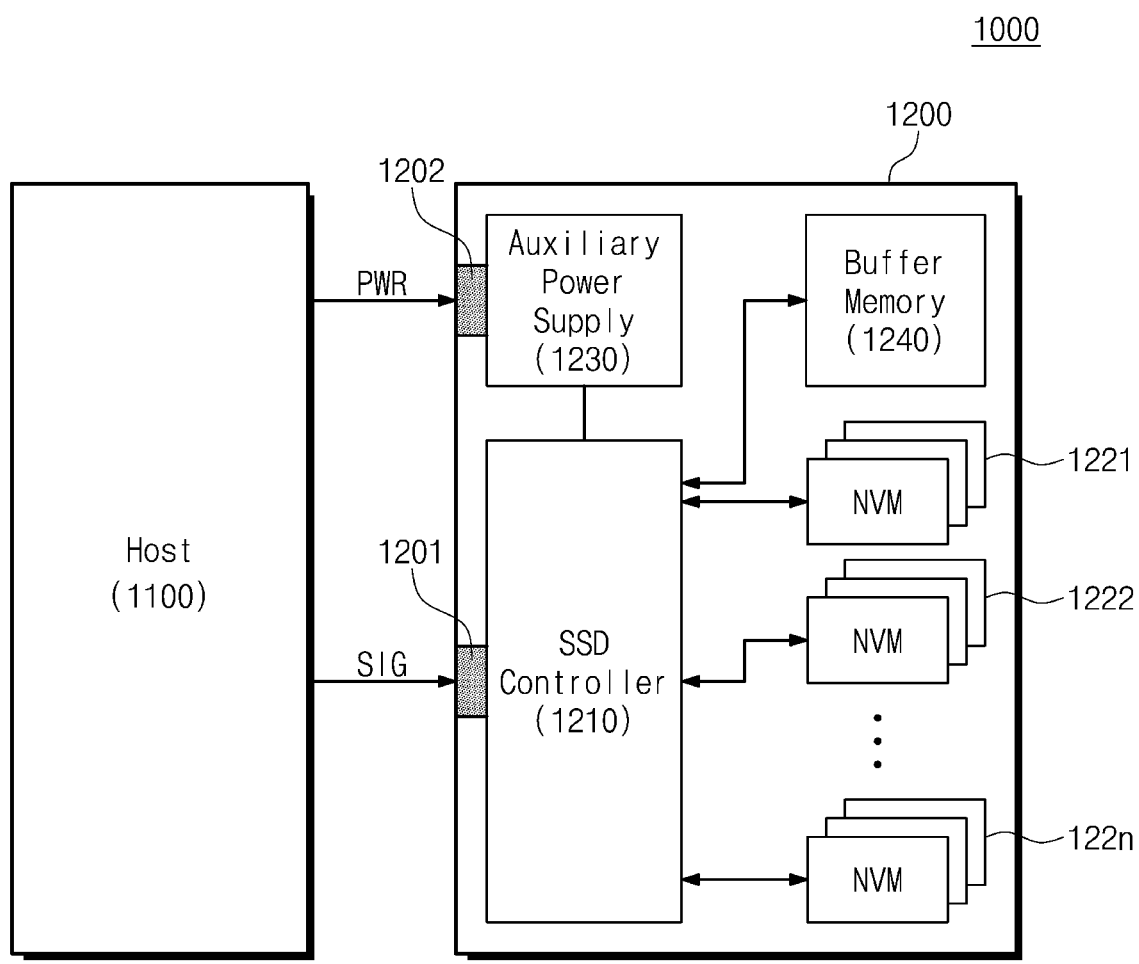
FIG. 28 is a block diagram illustrating a solid state drive (SSD) system to which a nonvolatile memory device according to an embodiment of the inventive concept is applied.

FIG. 28 is a block diagram illustrating a solid state drive (SSD) system 1000 to which a nonvolatile memory device according to the inventive concept is applied, according to an exemplary embodiment. Referring to FIG. 28, the SSD system 1000 includes a host 1100 and an SSD 1200.

The SSD 1200 exchanges signals SIG with the host 1100 through a signal connector 1201 and is supplied with a power PWR through a power connector 1202. The SSD 1200 includes an SSD controller 1210, a plurality of flash memories 1221 to 122*n*, an auxiliary power supply 1230, and a buffer memory 1240. In an exemplary embodiment, each of the plurality of flash memories 1221 to 122*n* may be configured to prevent a sensing error due to power noise influence described with reference to FIGS. 1 to 27.

The SSD controller 1210 may control the plurality of flash memories 1221 to 122*n* in response to the signals SIG received from the host 1100. The plurality of flash memories 1221 to 122*n* may operate under control of the SSD controller 1210. The auxiliary power supply 1230 is connected with the host 1100 through the power connector 1202. The auxiliary power supply 1230 may be charged by the power PWR supplied from the host 1100. When the power PWR is not smoothly supplied from the host 1100, the auxiliary power supply 1230 may power the SSD 1200.

According to aspects of the inventive concept, repeated performance of a sensing operation is not used in a situation where a read error occurs due to a power noise. As such, in a read operation, because an overhead due to again performing the sensing operation decreases, a nonvolatile memory device with improved performance and an operating method of the nonvolatile memory device are provided.

While the inventive concept has been described with reference to exemplary embodiments thereof, it will be apparent to those of ordinary skill in the art that various changes and modifications may be made thereto without departing from the spirit and scope of the following claims.

What is claimed is:

1. A nonvolatile memory device comprising:
   a memory cell array including a plurality of memory cells;
   a page buffer circuit connected to the memory cell array through a plurality of bit lines and configured to perform a sensing operation of sensing memory cells selected from the plurality of memory cells through the plurality of bit lines during a sensing time period;
   an input/output circuit configured to perform a data output operation of outputting data from the page buffer circuit to an external device through data lines; and
   a sensing time control circuit configured to adjust a duration of the sensing time period based on the data output operation during the sensing time period,
   wherein while a data output operation is not performed, the sensing time control circuit controls the page buffer circuit to perform a first sensing operation during the duration of the sensing time period having a first length of time, and
   wherein while the data output operation is performed, the sensing time control circuit controls the page buffer circuit to perform a second sensing operation during the duration of the sensing time period having a second length of time different from the first length of time.

2. The nonvolatile memory device of claim 1, wherein the sensing time control circuit is configured to adjust the sensing time period such that the sensing time period decreases in the second sensing operation compared to the first sensing operation.

3. The nonvolatile memory device of claim 2, wherein the sensing time control circuit is further configured to:
   extract a data output count value during the data output operation; and
   further decrease the sensing time period for subsequent sensing operations as the data output count value becomes greater.

4. The nonvolatile memory device of claim 3, wherein the data output count value is extracted based on a column address or the number of times of a transition of a data strobe signal.

5. The nonvolatile memory device of claim 3, wherein the sensing time control circuit is further configured to:
   decrease a default sensing time as much as an offset when the data output count value is greater than a first value and is smaller than a second value; and decrease the default sensing time as much as N times the offset (N being a positive number) when the data output count value is greater than the second value.

6. The nonvolatile memory device of claim 1, wherein each sensing operation includes a page buffer initialization phase, a bit line precharge phase, a sensing node develop phase, a sensing node sensing phase, and a recovery phase, and
wherein the sensing time control circuit is configured to, when the data output operation is performed while the sensing node develop phase is performed, adjust a time of the sensing node develop phase.

7. The nonvolatile memory device of claim 6, wherein the sensing node develop phase includes a first sensing node develop phase and a second sensing node develop phase, and
wherein the sensing time control circuit is configured to, while the first sensing node develop phase is performed, count a data output in the data output operation and to adjust a time of the second sensing node develop phase based on a value of counting the data output.

8. The nonvolatile memory device of claim 1, further comprising:
a power noise detect circuit configured to detect a voltage change of a sensing node of the page buffer circuit due to a power noise and to transmit a power noise signal including information about a direction of the voltage change of the sensing node to the sensing time control circuit,
wherein the sensing time control circuit is configured to adjust the sensing time period based on the power noise signal.

9. The nonvolatile memory device of claim 8, wherein the sensing time control circuit is further configured to:
when the power noise signal indicates a voltage increase of the sensing node due to the power noise, adjust the sensing time period such that the sensing time increases; and
when the power noise signal indicates a voltage decrease of the sensing node due to the power noise, adjust the sensing time period such that the sensing time period decreases.

10. The nonvolatile memory device of claim 9, wherein each sensing operation includes a page buffer initialization phase, a bit line precharge phase, a sensing node develop phase, a sensing node sensing phase, and a recovery phase, and
wherein, in the case where the data output operation is performed while the sensing node develop phase of the sensing operation is performed, adjustment of the sensing time period includes the sensing time control circuit adjusting the sensing time period such that a time period of the sensing node develop phase increases when a voltage of the sensing node increases and adjusting the sensing time period such that the time period of the sensing node develop phase decreases when the voltage of the sensing node decreases.

11. The nonvolatile memory device of claim 9, wherein the sensing time control circuit is further configured to:
extract a data output count value during the data output operation;
further increase the sensing time when a voltage of the sensing node increases as the data output count value becomes greater; and
further decrease the sensing time when the voltage of the sensing node decreases as the data output count value becomes greater.

12. An operating method of a nonvolatile memory device, the method comprising:
performing, at a page buffer circuit, a first sensing operation on a first page;
performing, at the page buffer circuit, a second sensing operation on a second page; and
performing, at an input/output circuit, a first data output operation for the first page while performing the second sensing operation,
performing, at the page buffer circuit, a third sensing operation on a third page; and
performing, at the input/output circuit, a second data output operation for the second page while the third sensing operation is performed,
wherein the first sensing operation is performed for a first time duration, and the second sensing operation is performed for a second time duration shorter than the first time duration,
wherein the third sensing operation is performed for a third time duration shorter than the first time duration, and
wherein, when a data output count value during the first data output operation is a first value and a data output count value during the second data output operation is a second value greater than the first value, the third time duration is shorter than the second time duration.

13. The method of claim 12, wherein each of the first and second sensing operations includes a page buffer initialization phase, a bit line precharge phase, a sensing node develop phase, a sensing node sensing phase, and a recovery phase, and
wherein the sensing node develop phase of the first sensing operation is performed for a fifth time duration, and the sensing node develop phase of the second sensing operation is performed for a sixth time duration shorter than the fifth time duration.

14. The method of claim 12, further comprising:
receiving a cache read command from an external device,
wherein the first sensing operation, the second sensing operation, and the first data output operation are performed in response to the cache read command.

15. A nonvolatile memory device comprising:
a memory cell array including a first plane and a second plane;
a first page buffer connected with the first plane through first bit lines and configured to perform a first sensing operation on the first plane during a first sensing time period;
a second page buffer connected with the second plane through second bit lines and configured to perform a second sensing operation on the second plane during a second sensing time period;
an input/output circuit configured to perform a first data output operation of outputting data from the first page buffer to an external device through data lines and a second data output operation of outputting data from the second page buffer to an external device through data lines; and
a sensing time control circuit configured to adjust the second sensing time period based on the first data output operation during the second sensing operation,
wherein while a data output operation is not performed, the sensing time control circuit controls the first page buffer to perform the first sensing operation during the first sensing time period having a first length of time, and wherein while the first data output operation is performed, the sensing time control circuit controls the second page buffer to perform the second sensing operation during the second sensing time period having a second length of time different from the first length of time.

16. The nonvolatile memory device of claim 15, wherein the first sensing operation is performed in response to a first command, wherein the second sensing operation is performed in response to a second command, and wherein the second command is a command received from the external device while the first sensing operation is performed.

17. The nonvolatile memory device of claim 16, wherein the second sensing operation is an operation performed in response to the second command while the first sensing operation is performed.

18. The nonvolatile memory device of claim 17, wherein each of the first and second sensing operations includes a page buffer initialization phase, a bit line precharge phase, a sensing node develop phase, a sensing node sensing phase, and a recovery phase, and wherein the sensing time control circuit is further configured to:

in the case of intending to start the page buffer initialization phase of the first sensing operation while the sensing node develop phase of the second sensing operation is performed, delay the page buffer initialization phase of the first sensing operation.

19. The nonvolatile memory device of claim 15, wherein the first plane includes a first plurality of memory cells, and the second plane includes a second plurality of memory cells, wherein the first sensing operation senses memory cells selected from the first plurality of memory cells through the first bit lines, and wherein the second sensing operation senses memory cells selected from the second plurality of memory cells through the second bit lines.

* * * * *